United States Patent
Bubel et al.

(10) Patent No.: US 12,362,237 B1
(45) Date of Patent: Jul. 15, 2025

(54) FILL-IN PLANARIZATION SYSTEM AND METHOD

(71) Applicant: Wolfspeed, Inc., Durham, NC (US)

(72) Inventors: Simon Bubel, Carrboro, NC (US); Alexander Kevin Shveyd, Chapel Hill, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/628,231

(22) Filed: Apr. 5, 2024

(51) Int. Cl.
  H01L 21/768 (2006.01)
  H01L 21/02 (2006.01)
  H01L 21/304 (2006.01)

(52) U.S. Cl.
  CPC .. H01L 21/76879 (2013.01); H01L 21/02529 (2013.01); H01L 21/02675 (2013.01); H01L 21/304 (2013.01)

(58) Field of Classification Search
  CPC ......... H01L 21/76879; H01L 21/02529; H01L 21/02675
  See application file for complete search history.

(56) References Cited

U.S. PATENT DOCUMENTS

| | | | |
|---|---|---|---|
| 9,299,630 B2 * | 3/2016 | Gowda | H01L 24/19 |
| 9,373,541 B2 * | 6/2016 | Chen | H01L 21/76843 |
| 9,443,636 B2 * | 9/2016 | Stupp | G02B 1/02 |
| 9,738,765 B2 * | 8/2017 | Brink | B05D 3/0453 |
| 9,835,310 B2 * | 12/2017 | Tamaki | F21K 9/60 |
| 9,924,592 B2 * | 3/2018 | Sekine | H01L 23/544 |
| 9,997,271 B2 * | 6/2018 | Stupp | H01B 1/121 |
| 9,997,272 B2 * | 6/2018 | Stupp | H01B 1/121 |
| 10,059,820 B2 * | 8/2018 | Brink | G03F 7/0002 |
| 10,562,130 B1 * | 2/2020 | Donofrio | B23K 26/032 |
| 10,576,585 B1 * | 3/2020 | Donofrio | B23K 26/0006 |
| 10,611,052 B1 * | 4/2020 | Bubel | H10D 62/8325 |
| 11,034,056 B2 * | 6/2021 | Bubel | B28D 5/0011 |
| 11,219,966 B1 * | 1/2022 | Donofrio | B23K 26/032 |

(Continued)

FOREIGN PATENT DOCUMENTS

| | | | |
|---|---|---|---|
| CN | 103590076 B | * | 11/2016 |
| CN | 113547449 A | * | 10/2021 |

(Continued)

OTHER PUBLICATIONS

Aminoroaya et al., "A Review of Dental Composites: Challenges, Chemistry Aspects, Filler Influences, and Future Insights", Composites Part B: Engineering, vol. 216, No. 108852, 2021, pp. 1-23.

(Continued)

*Primary Examiner* — Laura M Menz
(74) *Attorney, Agent, or Firm* — Dority & Manning, P.A.

(57) ABSTRACT

Systems and methods for laser-based surface processing operations on a wide bandgap semiconductor wafer, such as a silicon carbide semiconductor wafer, are provided. In one example, a method includes providing a semiconductor workpiece having a surface, the semiconductor workpiece including silicon carbide. The method includes providing a filler material on at least a portion of the surface. The method includes, subsequent to providing the filler material, performing a surface processing operation on the surface.

20 Claims, 14 Drawing Sheets

(56) References Cited

U.S. PATENT DOCUMENTS

| | | | | |
|---|---|---|---|---|
| 11,654,596 | B2* | 5/2023 | Bubel | B28D 5/0011 |
| | | | | 225/2 |
| 11,742,302 | B2* | 8/2023 | Pun | H01L 21/565 |
| | | | | 257/676 |
| 11,826,846 | B2* | 11/2023 | Donofrio | H01L 21/02021 |
| 11,842,937 | B2* | 12/2023 | Hardiman | H01L 23/3192 |
| 11,901,331 | B2* | 2/2024 | Fathi | H01L 25/0657 |
| 11,911,842 | B2* | 2/2024 | Donofrio | B28D 5/0064 |
| 12,024,794 | B2* | 7/2024 | Leonard | C30B 33/02 |
| 12,054,850 | B2* | 8/2024 | Khlebnikov | C30B 33/02 |
| 12,070,875 | B2* | 8/2024 | Bubel | H10D 62/8325 |
| 12,125,701 | B2* | 10/2024 | Khlebnikov | H01L 21/0242 |
| 12,125,806 | B2* | 10/2024 | Pun | H01L 23/492 |
| 2004/0012734 | A1* | 1/2004 | Yamanaka | G02F 1/133526 |
| | | | | 349/95 |
| 2007/0160928 | A1* | 7/2007 | Yamada | G03F 7/0755 |
| | | | | 430/270.1 |
| 2010/0039707 | A1* | 2/2010 | Akahane | G02B 3/0087 |
| | | | | 359/321 |
| 2011/0291284 | A1* | 12/2011 | Goldfarb | H01L 21/022 |
| | | | | 257/E21.59 |
| 2012/0190188 | A1* | 7/2012 | Zhao | H01L 21/76879 |
| | | | | 257/E21.584 |
| 2012/0319058 | A1* | 12/2012 | Stupp | G02B 1/02 |
| | | | | 252/582 |
| 2013/0069010 | A1* | 3/2013 | Stupp | C07D 487/14 |
| | | | | 252/500 |
| 2014/0029210 | A1* | 1/2014 | Gowda | H01L 23/3121 |
| | | | | 361/728 |
| 2014/0106150 | A1* | 4/2014 | Decker | C03C 21/002 |
| | | | | 428/319.1 |
| 2014/0220327 | A1* | 8/2014 | Adib | C03C 17/3435 |
| | | | | 428/217 |
| 2015/0159836 | A1* | 6/2015 | Tamaki | H10H 20/8514 |
| | | | | 362/343 |
| 2016/0207780 | A1* | 7/2016 | Dukes | C04B 35/5603 |
| 2016/0207781 | A1* | 7/2016 | Dukes | C08L 83/04 |
| 2016/0207783 | A1* | 7/2016 | Hopkins | C08L 83/04 |
| 2016/0208412 | A1* | 7/2016 | Sandgren | C08G 77/20 |
| 2016/0244581 | A1* | 8/2016 | Brink | H01L 21/0337 |
| 2016/0324016 | A1* | 11/2016 | Bellman | C03C 17/42 |
| 2016/0372229 | A1* | 12/2016 | Stupp | G02B 1/02 |
| 2017/0053721 | A1* | 2/2017 | Stupp | C07D 487/14 |
| 2017/0321025 | A1* | 11/2017 | Brink | B05D 3/0453 |
| 2018/0054887 | A1* | 2/2018 | Sekine | H01L 23/573 |
| 2018/0358327 | A1* | 12/2018 | Fathi | B32B 9/04 |
| 2019/0352226 | A1* | 11/2019 | Harris | C03C 21/002 |
| 2019/0367408 | A1* | 12/2019 | Harris | C03C 17/006 |
| 2020/0098891 | A1* | 3/2020 | Bih | H01L 21/321 |
| 2020/0361121 | A1* | 11/2020 | Bubel | B28D 5/0011 |
| 2021/0087105 | A1* | 3/2021 | Bellman | C03C 17/42 |
| 2021/0170632 | A1* | 6/2021 | Bubel | B28D 5/0011 |
| 2021/0198804 | A1* | 7/2021 | Khlebnikov | C30B 33/04 |
| 2022/0126395 | A1* | 4/2022 | Donofrio | B23K 26/40 |
| 2022/0130722 | A1* | 4/2022 | Parikh | H01L 21/76816 |
| 2022/0130773 | A1* | 4/2022 | Pun | H01L 23/492 |
| 2022/0181292 | A1* | 6/2022 | Fathi | B32B 37/1284 |
| 2022/0189768 | A1* | 6/2022 | Khlebnikov | H01L 21/02378 |
| 2022/0306902 | A1* | 9/2022 | Alety | H01L 21/3212 |
| 2022/0403552 | A1* | 12/2022 | Leonard | H10H 20/826 |
| 2023/0041380 | A1* | 2/2023 | Lifschitz Arribio | |
| | | | | G02B 6/0016 |
| 2023/0241803 | A1* | 8/2023 | Bubel | H10D 62/8325 |
| | | | | 225/2 |
| 2023/0352425 | A1* | 11/2023 | Pun | H01L 23/296 |
| 2024/0151971 | A1* | 5/2024 | Vora | G02B 5/1852 |
| 2024/0189940 | A1* | 6/2024 | Donofrio | B28D 5/0064 |
| 2024/0243031 | A1* | 7/2024 | Lin | H01L 23/5389 |
| 2024/0243106 | A1* | 7/2024 | Richter | H01L 25/072 |
| 2024/0258217 | A1* | 8/2024 | Dadvand | H01L 24/83 |
| 2024/0321659 | A1* | 9/2024 | Dadvand | H01L 24/48 |
| 2024/0321663 | A1* | 9/2024 | Dadvand | H01L 23/3142 |
| 2024/0344239 | A1* | 10/2024 | Leonard | C30B 33/02 |
| 2024/0352622 | A1* | 10/2024 | Khlebnikov | C30B 23/02 |
| 2024/0367348 | A1* | 11/2024 | Bubel | H10D 62/8325 |

FOREIGN PATENT DOCUMENTS

| | | | | |
|---|---|---|---|---|
| DE | 102015224318 | A1* | 6/2016 | B23K 26/0006 |
| DE | 102009012594 | B4* | 7/2020 | H01L 21/76877 |
| EP | 3902653 | B1* | 7/2024 | B23K 26/032 |
| EP | 4403293 | A2* | 7/2024 | B23K 26/032 |
| JP | 7315677 | B2* | 7/2023 | B23K 26/032 |
| JP | 2023159060 | A* | 10/2023 | B23K 26/032 |
| WO | WO-2010101069 | A1* | 9/2010 | B23K 26/0057 |
| WO | WO-2010132552 | A1* | 11/2010 | H01L 21/6835 |
| WO | WO-2013126927 | A2* | 8/2013 | B23K 26/0006 |
| WO | WO-2016049362 | A2* | 3/2016 | C01B 32/956 |
| WO | WO-2021202076 | A1* | 10/2021 | H01L 23/3677 |
| WO | WO-2023009405 | A1* | 2/2023 | H01L 21/56 |

OTHER PUBLICATIONS

Chen et al., "Effect of Laser Incidence Angle on the Femtosecond Laser Ablation Characteristics of Silicon Carbide Ceramics", Optics and Lasers in Engineering, vol. 172, No. 107849, 2024, pp. 1-18.

Cho et al., "Dental Resin Composites: A Review on Materials to Product Realizations", Composites Part B: Engineering, vol. 230, No. 109495, 2022, 65 pages.

Kinashi et al., "UV-Assisted Deposition of TEOS SiO2 Films Using the Spin-Coating Method", Applied Surface Science, vol. 79-80, 1994, pp. 332-337.

Li et al., "Surface Micromorphology and Nanostructures Evolution in Hybrid Laser Processes of Slicing and Polishing Single Crystal 4H—SiC", Journal of Materials Science & Technology, vol. 184, 2024, pp. 235-244.

Moszner et al., "New Developments of Polymeric Dental Composites", Progress in Polymer Science, vol. 26, Issue 4, 2001, pp. 535-576.

Theissmann et al., "High Performance Low Temperature Solution-Processed Zinc Oxide Thin Film Transistor", Thin Solid Films, vol. 519, Issue 16, 2011, pp. 5623-5628.

Geng et al., "Slicing of 4H—SiC Wafers Combining Ultrafast Laser Irradiation and Bandgap-Selective Photo-Electrochemical Exfoliation", Advanced Materials Interfaces, vol. 10, No. 2300200, 2023, pp. 1-7.

Kim et al., "4H—SiC Wafer Slicing by Using Femtosecond Laser Double-Pulses", Optical Materials Express, vol. 7, No. 7, Jul. 1, 2017, pp. 2450-2460.

Zhang et al., "A Review of Femtosecond Laser Processing of Silicon Carbide", MDPI Micromachines, vol. 15, No. 639, May 10, 2024, pp. 1-26.

Aixtron, "The First Domestic Silicon Carbide Ingot Laser Stripping Equipment was put into Production", Aug. 28, 2024, Morning News, https://www.compoundsemiconductorchina.net/industry-news.asp?id=6308, retrieved on Sep. 10, 2024 with machine translation, 4 pages.

Gie, "HGL Series Wafer Laser Stealth Cutting Equipment", Henan General Intelligent Equipment Co., Ltd., https://www.chngie.com/copy_HGL.html, retrieved on Sep. 10, 2024 with machine translation, 6 pages.

* cited by examiner

FILL-IN PLANARIZATION SYSTEM AND METHOD

FIELD

The present disclosure relates generally to semiconductor workpieces, and more particularly to surface processing of semiconductor workpieces, such as semiconductor wafers, for semiconductor device fabrication.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or Group III nitride-based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

One example aspect of the present disclosure is directed to a method. The method includes providing a semiconductor workpiece having a surface, the semiconductor workpiece including silicon carbide. The method includes providing a filler material on at least a portion of the surface. The method includes, subsequent to providing the filler material, performing a surface processing operation on the surface.

Another example aspect of the present disclosure is directed to a semiconductor wafer. The semiconductor wafer includes silicon carbide. The semiconductor wafer includes a filler material on at least a portion of a surface of the semiconductor wafer, the filler material being one or more of a spin coatable glass, an organosilicone, a hydrate, a photocurable composite, or a ceramic composite.

Another example aspect of the present disclosure is directed to a method. The method includes removing a wide bandgap semiconductor wafer from a boule using a laser-based removal process. The method includes providing a filler material on at least a portion of an exposed surface of the wide bandgap semiconductor wafer, the filler material at least partially filling one or more deep topographical areas on the exposed surface.

Another example aspect of the present disclosure is directed to a method. The method includes providing a semiconductor workpiece having a surface. The method includes providing a filler material on at least a portion of the surface. The method includes performing a grinding operation on the surface by presenting the surface against an abrasive containing surface of a grinding apparatus. In some examples, the filler material has a hardness sufficient to dress the abrasive containing surface of a grinding apparatus used during the grinding operation.

These and other features, aspects, and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
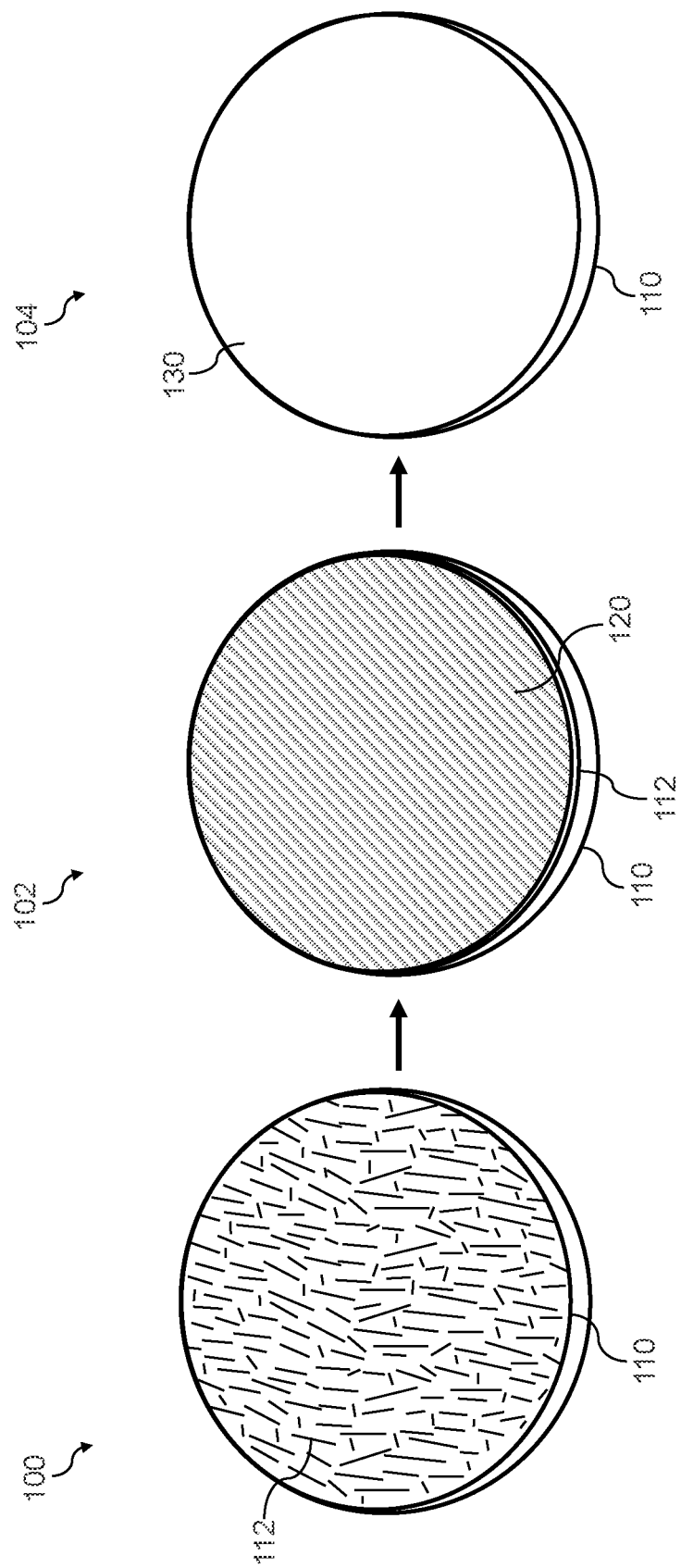
FIG. 1 depicts an example surface processing operation on an example semiconductor workpiece according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials, without deviating from the scope of the present disclosure. Example wide bandgap semiconductor materials include silicon carbide and the Group III-nitrides.

Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Example workpieces may include, for instance, carrier substrates, ingots, boules, polycrystalline substrates, monocrystalline substrates, and other semiconductor crystalline materials.

Power semiconductor devices may be fabricated using epitaxial layers formed on a semiconductor workpiece, such as a silicon carbide semiconductor wafer. Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc.). Example surface processing operations may include grinding operations, lapping operations, and polishing operations.

Grinding is a material removal process that is used to remove material from a semiconductor wafer or other semiconductor workpiece. Grinding may be used to reduce a thickness of a semiconductor wafer. Grinding typically involves exposing the semiconductor wafer to an abrasive containing surface, such as grind teeth on a grind wheel. Grinding may remove material of the semiconductor wafer through engagement with the abrasive surface.

Lapping is a precision finishing process that uses a loose abrasive in slurry form. The slurry typically includes coarse particles (e.g., largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a very smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a very smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving very low subsurface damage.

Grinding may include coarse grinding operations and fine grinding operations. Coarse grinding operations may be used to reduce a thickness of a silicon carbide semiconductor wafer by about 20 microns to about 200 microns, such by about 25 microns to about 100 microns, such as by about 25 microns to about 80 microns, such as by about 40 microns to about 60 microns, or the like. Fine grinding operations may be used to reduce a thickness of a silicon carbide semiconductor wafer by about 1 micron to about 20 microns, such as by about 3 microns to about 15 microns, such as by about 5 microns to about 10 microns, or the like. After grinding, the silicon carbide semiconductor wafer may be subject to other surface processing operations, such as lapping operations and/or polishing operations, such as chemical mechanical polishing (CMP) operations.

Some surface processing operations (e.g., grinding, lapping, polishing, etc.) may include planarizing rough or deeply grooved silicon carbide surfaces. Planar surface processing operations may expose a surface of the semiconductor workpiece to a generally planar tool surface (e.g., grinding wheel, grind disc, polishing pad) for removing and/or smoothing material. The planar tool surface may remove material from "peaks" in the rough surface before removing material from deep trenches or grooves in the rough surface. In this way, a planar surface processing operation may remove material from the semiconductor workpiece and reduce surface roughness. Example planar surface processing operations include using a polishing pad, grind disc, or grind wheel.

Non-planar surface processing operations do not use a planar tool surface. For instance, non-planar surface processing operations may remove material from peaks and from grooves in the surface indiscriminately (e.g., at a nearly uniform rate). As a result, non-planar surface processing operations may replicate the surface topography of a semiconductor workpiece as material is removed from the semiconductor workpiece instead of smoothing the surface topography of the semiconductor workpiece. Non-planar surface processing operations may effectively remove material from the semiconductor workpiece but may be less efficient at reducing surface roughness. For instance, non-planar surface processing operations may remove material from a surface such that a topographic trench gets wider and deeper and sharp topographic features may be rounded with a reduction in height. However, non-planar surface processing operations may not result in as planarized or as smooth a surface when compared to, for instance, planar surface processing operations. Example non-planar surface processing operations may include, for instance, laser-based surface processing operations, electrochemical operations, reactive ion etching (RIE) based surface processing operations, plasma-based surface processing operations, sputtering-based surface processing operations, and/or wet etch-based surface processing operations.

Example aspects of the present disclosure are directed to planarizing surfaces of semiconductor workpieces, such as semiconductor wafers. As used herein, planarizing a surface of a semiconductor workpiece includes reducing a surface roughness from a first surface roughness to a second surface roughness that is less than the first surface roughness. According to examples of the present disclosure, prior to performing a surface processing operation, a filler material may be applied to a surface (e.g., a rough surface) of a semiconductor workpiece and may fill any deep topographical areas and/or cover any topographical peaks to create a planarized surface on the semiconductor workpiece. The planarized surface with the filler material has a surface roughness that is less than a surface roughness of the surface prior to application of the filler material. The filler material and surface of the semiconductor workpiece may then be subjected to a surface processing operation, for instance, to remove material from the semiconductor workpiece and/or to smooth or planarize the surface of the semiconductor workpiece. By applying the filler material to the semiconductor workpiece surface prior to the surface processing operation, planar and/or non-planar surface processing operations may be used in a similar fashion to create a planarized surface with less surface roughness.

Aspects of the present disclosure refer to and/or claim a "surface roughness" of a surface. As used herein, unless otherwise specifically noted, the surface roughness is measured as "areal average roughness" Sa. When the present disclosure or claims refer to a surface having a surface roughness being within a range of values, a surface has a surface roughness in the range of values if any 1 millimeter by 1 millimeter area on the surface includes a surface roughness Sa within the specified range of values or if any 1 millimeter by 1 millimeter area on the surface includes a surface roughness Sz (maximum height) within the specified range of values.

As an example, a surface has a surface roughness in a range of 0.5 nanometers to 180 nanometers if any 1 millimeter×1 millimeter area on the surface has a surface roughness Sa in the range of 0.5 nanometers to 180 nanometers or if any 1 millimeter×1 millimeter area on the surface has a surface roughness Sz in the range of 0.5 nanometers to 180 nanometers. For the sake of clarity, it is not required that the entire surface have the surface roughness in the specified range of values. Only a single 1 millimeter×1 millimeter area on the surface is required to have a surface roughness in the specified range of values (e.g., either Sa or Sz) for the surface to be considered to have a surface roughness in the specified range of values.

In some examples, the filler material may have a matched removal rate to the material of the semiconductor workpiece (e.g., silicon carbide) for the respective surface processing operation of choice. For instance, the removal rate associated with the semiconductor workpiece may be within about 20% of the removal rate associated with the filler material for the surface processing operation. By including a filler material with a similar removal rate, the surface of the semiconductor workpiece may be planarized regardless of the type of surface processing operation, whether it is a planar surface processing operation or a non-planar surface processing operation.

In some examples, the filler material may have a lower removal rate relative to the material of the semiconductor workpiece (e.g., silicon carbide) for the surface processing operation and/or may not be removed (e.g., zero removal rate) during the surface processing operation. In these examples, the surface processing operation may remove the material of the semiconductor workpiece (e.g., silicon carbide) without removing the filler material and/or may remove the filler material at a reduced rate). The filler material can then be removed in a subsequent processing operation.

In some examples, the filler material may have properties (e.g., optical properties, thermal properties, electrochemical properties, rheological properties, etc.) that alter the speed of removal of material from deep topographical areas relative to higher topographical areas on the semiconductor workpiece that are covered by or include less filler material or no filler material. For instance, in the example of a laser-based surface processing operation, the filler material may include optical properties (e.g., refractive index, transmissivity, reflectivity, etc.) that change the application of a laser to a surface of the semiconductor workpiece (e.g., change the focal depth, scatter the laser, reduce laser pulse energy, etc.). In this way, the filler material may slow down or otherwise affect laser ablation of deep topographical areas relative to other areas on the semiconductor workpiece. As another example, the filler material may include one or more properties that affect the removal rate of an etching process (e.g., plasma-based etch process, sputtering process, and/or a wet etch process) at deep topographical areas relative to other areas on the semiconductor workpiece.

In some examples, the surface of the semiconductor workpiece may have a reduced surface roughness after undergoing a surface processing operation. For instance, prior to the surface processing operation and application of the filler material, the surface of the semiconductor workpiece may include a surface roughness greater than about 10 microns, such as greater than about 50 microns, such as greater than about 65 microns. However, after undergoing a surface processing operation, the surface of the semiconductor workpiece may include a surface roughness of less than about 65 microns, such as less than about 10 microns, such as less than about 1 micron, such as less than about 500 nanometers, such as less than about 100 nanometers, such as less than about 10 nanometers.

The filler material may have a variety of properties based on the surface removal process and the material of the semiconductor workpiece, such as adhesion to the semiconductor material, material hardness, capability to withstand processing temperature (e.g., up to about 1200° C.), electrically conductive properties, optical properties, rheological properties, wettability, and/or coefficient of thermal expansion for a selected surface processing operation. In some examples, the filler material may stay a liquid that is replenished during a surface processing operation (e.g., a non-planar surface processing operation). Additionally, in some examples, the filler material may have a hardness sufficient to dress (e.g., clean off and expose particulate) an abrasive tool used in a post-filler surface processing operation, such as a grinding operation.

For instance, in some examples, the filler material may be a liquid. The liquid may fill deep topographical areas in at least a portion of the surface of the semiconductor workpiece. The liquid may be continuously supplied or resupplied during a surface processing operation to replenish liquid on the surface of the semiconductor workpiece during a surface processing operation. In some embodiments, the semiconductor workpiece may be at least partially submerged (e.g., fully submerged) in the liquid filler material during the surface processing operation.

In some examples, the filler material may be applied via a dip-coating, spray-coating, spin-coating, printing, and/or a brush coating process. In some examples, a liquid filler material may be applied via doctor blading and/or condensation techniques.

In some examples, the filler material may be a sol-gel defined liquid. In some examples, the filler material may be a spin-coatable glass. In some examples, the filler material may be or include organosilicone, such as tetraethyl orthosilicate (TEOS), tetramethylcyclotetra-siloxane (TMCTS), polydimethylsiloxane (PDMS), cyclic siloxanes, or related compounds. In some examples, the filler material may be a hydrate with a metal oxide precursor (e.g., $ZnO_x\ H_2O$) or nitrate precursor (e.g., $Ga(NO_3)_3 xH_2O$). While example materials have been discussed herein, it should be appreciated that any sol gel processes that create liquid processable materials with properties required for a selected surface removal process may be used as a filler material according to the present disclosure.

In some examples, the filler material may be a non-sol gel material that may fill the substrate surface topography. For instance, the filler material may be a curable liquid composite that may be engineered to fill deep topographical areas, adhere to surfaces, and be curable into a hard solid through a curing process via exposure to radiation (e.g., visible light, UV light, infrared light). In some examples, the filler material may be cured through any suitable curing processes, such as photo-curing, thermal curing, chemical curing, microwave curing, pressure curing, ambient curing, electromagnetic radiation curing, electrochemical curing, or other suitable curing processes.

As an example, the filler material may be a photo-curable resin-based composite (PCRB). Suitable PCRB's may be a mixture of photopolymerizable monomers, photoactive polymerization initiators, and a surface functionalized filler (SFF).

In some examples, the PCRB may include a resin binder with a mixture of two methacrylate terminated monomers that may include, for instance, a base monomer and diluent monomer. Example base monomers may include, for instance, bisphenol A glycol dimethacrylate (Bis-GMA), ethoxylated bisphenol A glycol dimethacrylate (Bis-EMA), or urethane dimethacrylate (UDMA). Example dilutant monomers may include, for instance, triethylene glycol dimethacrylate (TEDGMA), decanediol dimethacrylate (D3MA), or 2-hydroxyethyl methacrylate (HEMA). Filler materials that include a PCRB with a resin binder may be curable using a free radical initiator. Example free radical initiators may include a camphorquinone mixed with an amine photo-polymerization accelerator such as ethyl 4-(dimethylamino)benzoate, N,N-dimethylaminoethyl methacrylate, 2-ethyl-dimethylbenzoate, N,N-dimethyl-p-toluidine, or N-phenylglycine.

In some examples, the SFFs in the PCRB may include microparticles or nanoparticles of, for instance, ceramics, inorganic compounds, metals, metalloids, minerals, non-metallic elements, inorganic-inorganic hybrid materials, inorganic-inorganic composites, organic compounds, organic-inorganic hybrid materials, organic-inorganic composites, or similar materials. The surface functionalized fillers may include microparticles or nanoparticles with matched properties to a semiconductor wafer material and surface removal process. In some example SFFs, compounds may be used to functionalize the surface of the particles, promote dispersion and couple to the resin matrix during curing of a PCRB. In some examples, these compounds may include 10-methacryloyloxydecyl dihydrogen phosphate, dipentaerythritol penta-acrylate phosphate, thiourethane oligomers, or similar materials.

In some examples, the semiconductor workpiece may be exposed to a variety of surface processing operations after the filler material is applied to the surface. For instance, the semiconductor workpiece may be subjected to a planar surface processing operation and/or a non-planar surface processing operation. Example planar surface processing operations may include, for instance, providing the surface of the workpiece against a planar surface (e.g., with or without a slurry), such as a polishing pad, grind disc, grinding teeth on a grind wheel, lapping surface, etc. Example planar surface processing operations may include, for instance, grinding operations and/or polishing operations (e.g., CMP operations). Example non-planar surface processing operations do not expose the surface of the workpiece to a planar surface. Example non-planar surface processing operations may include, for instance, laser-based surface processing operations, electrochemical operations, reactive ion etching (RIE) based surface processing operations, plasma-based surface processing operations, sputtering-based surface processing operations, and/or wet etch-based surface processing operations. In example embodiments that use a plasma-based surface processing operation, the plasma generated during the plasma-based surface processing operation may generate radiation to cure the filler material on the semiconductor workpiece.

In some examples, the filler material may be continuously applied to at least a portion of a surface of the semiconductor workpiece (e.g., as a liquid) during a surface processing operation (e.g., laser-based surface processing operation). In some examples, the filler material may only be applied and/or cured on discrete portions of the semiconductor workpiece at a time. For instance, in some examples, a scanning head (e.g., optical scanning head) may apply a filler material and/or may cure the filler material (e.g., using an optical curing source, thermal curing source, laser curing source, radiative curing source, etc.) to discrete portions of the surface of the semiconductor workpiece.

In some examples, the filler material may be applied and/or cured in a scanning pattern on the semiconductor workpiece. For instance, the filler material source may apply a filler material to the surface of the semiconductor workpiece along scan lines, passes, or other motions along the surface of the semiconductor workpiece. The scan patterns may include, for instance, a plurality of parallel lines, perpendicular lines, a spiral pattern, concentric circles, a chevron pattern, a herringbone pattern, or other regular pattern or irregular pattern.

In some examples, during a laser-based surface processing operation, a laser may scan a surface of the semiconductor workpiece to remove material from the semiconductor workpiece along one or more scan lines in a scan pattern. In some examples, a filler material source may provide a filler material (e.g., a liquid) onto the surface of the semiconductor workpiece prior to (e.g., immediately prior to) scanning the portion of the surface with the laser. The filler material source may provide the filler material along a scan path in a scan pattern corresponding to a scan path associated with one or more lasers during the laser-based surface processing operation. The filler material source may be attached to the laser source or may be separate from the laser source.

In some examples, the semiconductor workpiece may be a removed portion of a boule that has been removed, for instance, using a wire saw or a laser-based removal process. The semiconductor workpiece may include a rough surface after removal from the boule. The rough surface may then have a filler material applied to it before exposing the rough surface to a surface processing operation that creates a planar surface on the semiconductor workpiece.

In some examples, the filler material may act as a carrier substrate for the workpiece. For instance, the filler material may have a thickness of greater than about 100 microns, such as about 150 microns or greater, such as about 200 microns or greater, such as about 500 microns or greater, such as about 1000 microns or greater. The filler material with increased thickness can act as a carrier substrate for the semiconductor workpiece. In this way, the semiconductor workpiece may be handled and processed via the carrier substrate made at least partially from the filler material.

In some examples, the filler material may serve to dress an abrasive material on an abrasive-containing surface during a surface processing operation. For instance, a surface processing operation may expose a portion of a semiconductor wafer to a tool surface with an abrasive containing surface having one or more abrasive elements. The abrasive containing material may be subjected to glazing of the abrasive containing surface as the one or more abrasive elements become worn. The filler material may have a hardness sufficient to dress the abrasive containing surface. For instance, the filler material may remove some of the abrasive elements in the abrasive-containing surface and expose new abrasive elements.

Aspects of the present disclosure provide a number of technical effects and benefits. For instance, the use of non-planar surface processing operations and devices may be effectively used to smooth and/or to create more planar surfaces on semiconductor workpieces. Using non-planar surface process operations instead of some planar surface processing operations may reduce tool consumption and increase process efficiency due to the lack of contact between the tool and workpiece commonly found in non-planar surface processing operations (e.g., laser-based surface processing operation, plasma-based surface processing operation, sputtering-based surface processing operation, wet etch-based surface processing operation, etc.). Further, the planarization of the semiconductor workpiece surface with a filler material prior to surface processing operations (e.g., surface removal operations) may allow for reduced tool consumption and cost when using planar surface removal tools due to uniform wear, contact, and pressure on the planar surface of the tool. When the tool contacts the planar surface, it may wear the tool evenly as opposed to wear spots in areas of significant uneven roughness which result in wasted tool material.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 depicts an overview of an example surface processing operation 100 for a semiconductor workpiece 110 according to example aspects of the present disclosure. The semiconductor workpiece 110 may, in some examples, be a wide bandgap semiconductor wafer, such as a silicon carbide semiconductor wafer. The semiconductor workpiece 110 may include a diameter of about 100 millimeters, about 150 millimeters, about 200 millimeters, or other diameter. Before undergoing a surface processing operation, the semiconductor workpiece 110 may include a rough surface 112 with pluralities of valleys (e.g., deep topographical areas) and peaks (e.g., high topographical areas). The rough surface 112 may be a regular pattern or an irregular pattern. In some embodiments, the rough surface 112 may include a surface roughness greater than about 10 microns, such as greater than about 50 microns, such as greater than about 65 microns. In some examples, the rough surface 112 may be the result of a previous semiconductor processing operation (e.g., a removal process separating the workpiece 110 from a boule).

At 102, the semiconductor workpiece 110 may have a filler material 120 applied on the rough surface 112. The filler material 120 may fill valleys and cover the peaks across the rough surface 112 of the semiconductor workpiece 110 to create a more planar surface on top of the rough surface 112. The planar surface of the filler material 120 may have a surface roughness that is less than the surface roughness of the semiconductor workpiece 110 prior to application of the filler material 120. For instance, the planar surface of the filler material 120, in some examples, may have a surface roughness of less than about 65 microns, such as less than about 50 microns, such as less than about 10 microns, such as less than about 1 micron, such as less than about 500 nanometers, such as less than about 100 nanometers, such as in a range of about 0.5 nanometers to about 180 nanometers, such as in range of about 180 nanometers to about 1 micron, such as in a range of about 1 micron to about 10 microns, such as in a range of about 1 micron to about 65 microns. In some examples, the planar surface may be entirely made of the filler material 120 with the rough surface 112 being entirely covered by the filler material 120. In some examples, the planar surface may include portions of the rough surface 112 (e.g., peaks or high topographical areas) and the filler material 120.

The filler material 120 may be applied through a variety of methods. For instance, in some examples, the filler material 120 may be applied via dip-coating, spray-coating, spin-coating, printing, and/or a brush coating process. In some examples, the filler material 120 may be applied via doctor blading and/or condensation techniques. Other suitable techniques may be used to provide the filler material 120 on the semiconductor workpiece 110 without deviating from the scope of the present disclosure.

For instance, in some examples the filler material 120 is a liquid. The liquid filler material 120 may fill deep topographical areas in at least a portion of the rough surface 112 of the semiconductor workpiece 110. The liquid may be continuously supplied or resupplied during a surface processing operation 100 to replenish liquid on the rough surface 112 of the semiconductor workpiece 110 during a surface processing operation. In some embodiments, the semiconductor workpiece 110 may be at least partially submerged (e.g., fully submerged) in the liquid filler material during the surface processing operation 100.

In some examples, the filler material 120 is printed, for instance, in low topographical areas on the semiconductor workpiece 110. For instance, a semiconductor workpiece 110 may have a grind dimple or center dimple as a result of a grind process. The filler material 120 may be provided on the surface of the semiconductor workpiece 110 (e.g., by printing) to fill in the dimple. In some examples, additive printing may be used to build up a filler material that acts as a carrier for the semiconductor workpiece 110, as described below.

FIG. 1 illustrates the filler material 120 covering the entire rough surface 112 of the semiconductor workpiece 110. However, in other examples, the filler material 120 may only cover a portion of the semiconductor workpiece 110 as will be described in more detail below.

In some examples, the filler material 120 may have one or more characteristics such that the filler material 120 has a removal rate that is similar to a removal rate associated with the material of the rough surface 112 of the semiconductor workpiece 110 (e.g., silicon carbide) during the surface processing operation 100. In some examples, a removal rate of the filler material 120 is within 20% of the removal rate associated with the material of the rough surface 112 of the semiconductor workpiece 110 (e.g. silicon carbide) for the surface processing operation 100. By including a filler material 120 with a similar removal rate, the rough surface 112 of the semiconductor workpiece 110 may be planarized regardless of the type of surface processing operation 100, whether it is a planar surface processing operation or a non-planar surface processing operation.

In some examples, the filler material 120 may have a lower removal rate relative to the material of the rough surface 112 of the semiconductor workpiece 110 (e.g., silicon carbide) for the surface processing operation 100 and/or may not be removed (e.g., zero removal rate) during the surface processing operation 100. In these examples, the surface processing operation 100 may remove the material of the rough surface 112 of the semiconductor workpiece 110 (e.g., silicon carbide) without removing the filler material 120 and/or may remove the filler material 120 at a reduced rate). This may allow for removal of high topographical areas on the rough surface 112 of the workpiece 110 prior to removal of low topographical areas on the rough surface 112 of the workpiece 110, leading to a more planarized surface as a result of the surface processing operation 100. The filler material 120 can then be subsequently removed in a subsequent processing operation 100.

In some examples, the filler material 120 may have properties (e.g., optical properties, thermal properties, electrochemical properties, rheological properties, etc.) that alter the speed of removal of material from deep topographical areas relative to higher topographical areas on the rough surface 112 of the semiconductor workpiece 110 that are covered by or include less filler material 120 or no filler material 120. For instance, in the example of a laser-based surface processing operation, the filler material 120 may include optical properties (e.g., refractive index, transmissivity, reflectivity, etc.) that change the application of a laser to a rough surface 112 of the semiconductor workpiece 110 (e.g., change the focal depth, scatter the laser, reduce laser pulse energy, etc.). In this way, the filler material 120 may slow down or otherwise affect laser ablation of deep topographical areas relative to other areas on the rough surface 112 of the semiconductor workpiece 110. As another example, the filler material 120 may include one or more properties that affect the removal rate of an etching process (e.g., plasma-based etch process, sputtering process, and/or a wet etch process) at deep topographical areas relative to other areas on the rough surface 112 of the semiconductor workpiece 110.

In some examples, the filler material 120 may be a sol-gel defined liquid. In some examples, the filler material 120 may be a spin-coatable glass. In some examples, the filler material 120 may be a ceramic composite. In some examples, the filler material 120 may be or include organosilicone, such as tetraethyl orthosilicate (TEOS), tetramethylcyclotetra-siloxane (TMCTS), polydimethylsiloxane (PDMS), cyclic siloxanes, or related compounds. In some examples, the filler material 120 may be a hydrate with a metal oxide precursor (e.g., ZnOx H$_2$O) or nitrate precursor (e.g., Ga(NO$_3$)$_3$xH$_2$O). While example filler materials 120 have been discussed herein, it should be appreciated that any sol gel processes that create liquid processable materials with properties required for a selected surface removal process may be used as a filler material 120 according to the present disclosure.

In some examples, the filler material 120 may be a non-sol gel material that may fill the substrate surface topography. For instance, the filler material 120 may be a curable liquid composite that may be engineered to fill voids, adhere to surfaces, and be curable into a hard solid through a curing process via exposure to radiation (e.g., visible light, infrared light, UV light, microwave radiation). In some examples, the filler material 120 may be cured through any suitable curing processes, such as photo-curing, thermal curing, chemical curing, microwave absorption curing, pressure curing, ambient curing, electrochemical curing, or other suitable curing processes.

As an example, the filler material 120 may be a photocurable resin-based composite (PCRB). Suitable PCRB's may be a mixture of photopolymerizable monomers, photoactive polymerization initiators, and a surface functionalized filler (SFF).

In some examples, the PCRB may include a resin binder with a mixture of two methacrylate terminated monomers that may include, for instance, a base monomer and diluent monomer. Example base monomers may include, for instance, bisphenol A glycol dimethacrylate (Bis-GMA), ethoxylated bisphenol A glycol dimethacrylate (Bis-EMA), or urethane dimethacrylate (UDMA). Example dilutant monomers may include, for instance, triethylene glycol dimethacrylate (TEDGMA), decanediol dimethacrylate (D3MA), or 2-hydroxyethyl methacrylate (HEMA). Filler materials 120 that include a PCRB with a resin binder may be curable using a free radical initiator. Example free radical initiators may include a camphorquinone mixed with an amine photo-polymerization accelerator such as ethyl 4-(dimethylamino)benzoate, N,N-dimethylaminoethyl methacrylate, 2-ethyl-dimethylbenzoate, N,N-dimethyl-p-toluidine, or N-phenylglycine.

In some examples, the SFFs in the PCRB may include microparticles or nanoparticles of, for instance, ceramics, inorganic compounds, metals, metalloids, minerals, non-metallic elements, inorganic-inorganic hybrid materials, inorganic-inorganic composites, organic compounds, organic-inorganic hybrid materials, organic-inorganic composites, or similar materials. The surface functionalized fillers may include microparticles or nanoparticles with matched properties to a semiconductor workpiece 110 material and surface removal process. In some example SFFs, compounds may be used to functionalize the surface of the particles, promote dispersion and couple to the resin matrix during curing of a PCRB. In some examples, these compounds may include 10-methacryloyloxydecyl dihydrogen phosphate, dipentaerythritol penta-acrylate phosphate, thiourethane oligomers, or similar materials.

The semiconductor workpiece 110 with the filler material 120 may be subjected to the surface processing operation 100 at 104. In some examples, the surface processing operation 100 may be a planar surface processing operation. Example planar surface processing operations may include providing the surface of the workpiece against a planar surface (e.g., with or without a slurry), such as a polishing pad, grind disc, grinding teeth on a grind wheel, lapping surface, etc. Example planar surface processing operations may include grinding, polishing, lapping, CMP, etc. In some examples, the surface processing operation 100 may be a non-planar surface processing operation. Example non-planar surface processing operations do not expose the rough surface 112 of the semiconductor workpiece 110 to a planar surface. Example non-planar surface processing operations may include, for instance, laser-based surface processing operations, electrochemical operations, reactive ion etching (RIE) based surface processing operations, plasma-based surface processing operations, sputtering-based surface processing operations, and/or wet etch-based surface processing operations.

As shown at 104, after undergoing the surface processing operation 100, the semiconductor workpiece 110 may include a planar surface 130. The planar surface 130 may be a surface that has a surface roughness that is less than a surface roughness of the rough surface 112. For instance, the planar surface 130, in some examples, may have a surface roughness of less than about 65 microns, such as less than about 50 microns, such as less than about 10 microns, such as less than about 1 micron, such as less than about 500 nanometers, such as less than about 100 nanometers, such as less than about 10 nanometers. In some examples, the semiconductor workpiece 110 may have no filler material 120 remaining on the planar surface 130. The filler material 120 and the rough surface 112 may both be removed by the surface processing operation 100. In some examples, the planar surface 130 may include some remaining filler material 120.

Figure 2A:
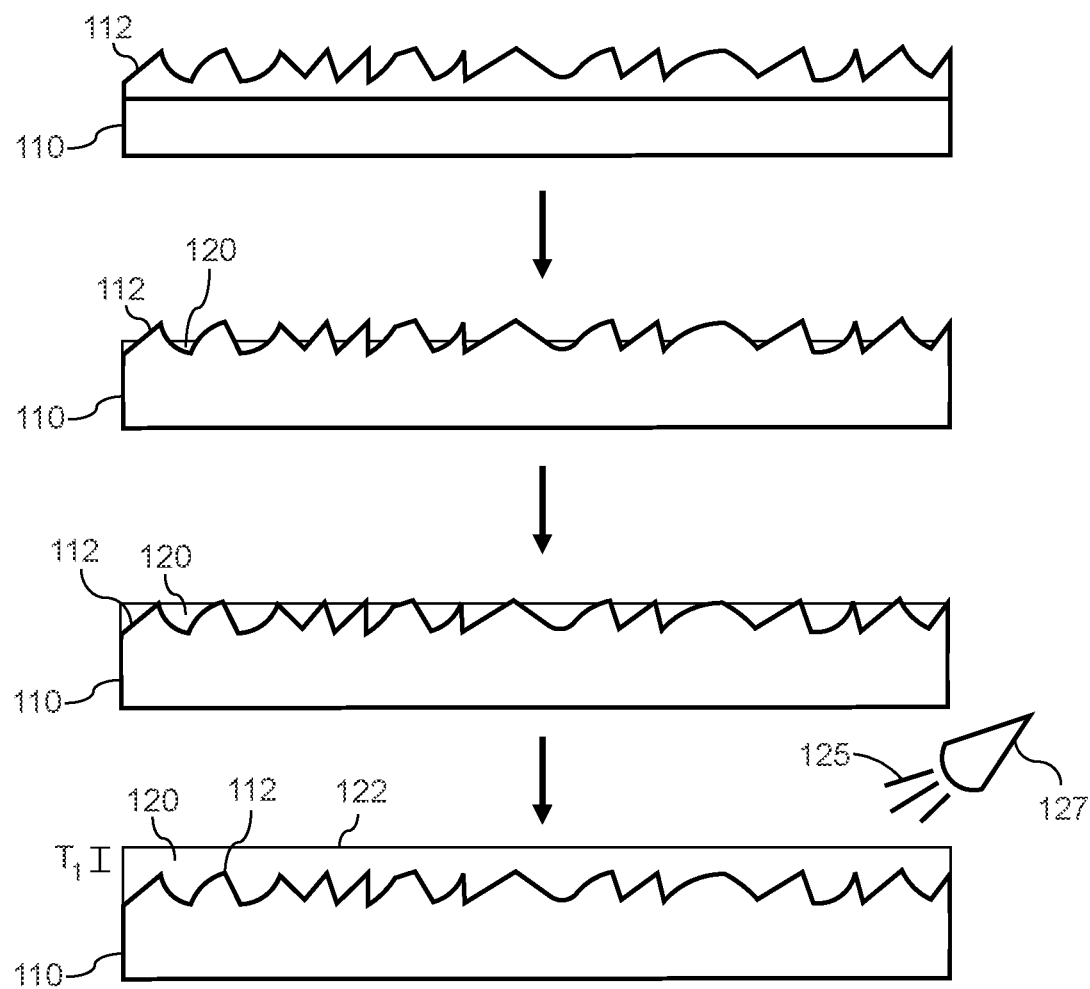
FIGS. 2A, 2B, and 2C depict an example application of filler material to a semiconductor workpiece according to example aspects of the present disclosure.
Figure 2B:
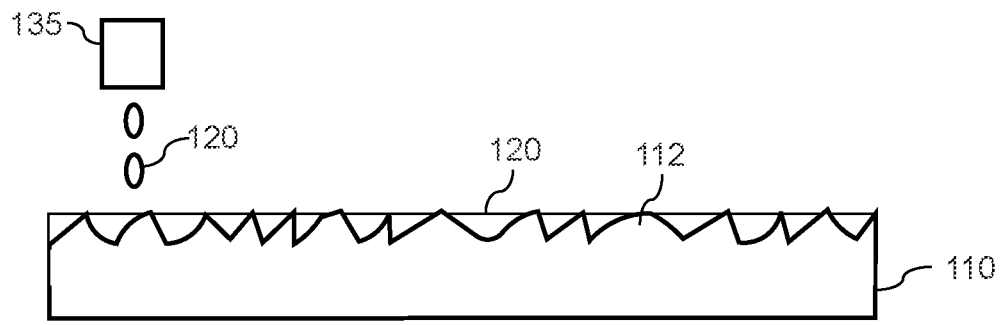
Figure 2C:
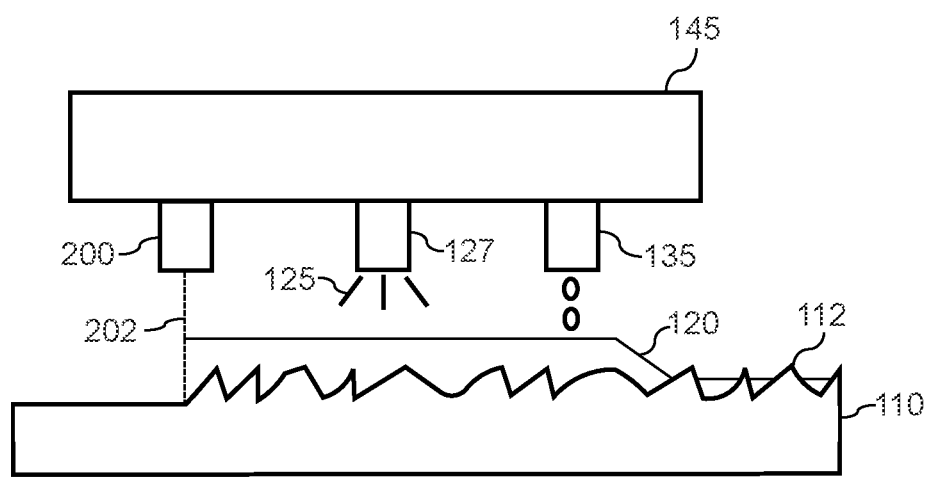

FIGS. 2A-2C depict cross-sectional views of providing filler material 120 to a rough surface 112 of a semiconductor workpiece 110 according to example aspects of the present disclosure. More particularly, FIG. 2A depicts a cross-sectional view of an example application of filler material 120 to at least a portion of a semiconductor workpiece 110 according to example aspects of the present disclosure. As discussed above, the filler material 120 may be applied via a dip-coating, spray-coating, printing, spin-coating, and/or a brush coating process. In some examples, the filler material 120 may be applied via doctor blading and/or condensation techniques.

As shown in FIG. 2A, the filler material 120 may be provided or deposited such that the filler material 120 may first fill the deep topographical areas in the rough surface 112 of the semiconductor workpiece 110. The filler material 120 may fill the deep topographical areas and eventually cover the peaks in the rough surface 112 of the semiconductor workpiece 110. In some examples, the filler material 120 may be applied such that the filler material 120 extends beyond the highest peak of the rough surface 112 by a thickness T1. The thickness T1 may be, for instance, in a range of about 10 nanometers to about 100 microns, such as about 100 nanometers to be about 1 micron, such as about 1 micron to about 10 microns, such as about 1 micron to about 5 microns. In some examples, the thickness T1 may be about 10 nanometers to about 750 nanometers, such as about 10 nanometers to about 100 nanometers.

In examples where the filler material 120 includes a curable material, a curing source 127 may provide a stimulus to cure the curable material. The curing source 127 may be configured to cure the curable material through any suitable curing process, such as photo-curing, thermal curing, chemical curing, microwave absorption curing, pressure curing, ambient curing, electrochemical curing, or other suitable curing processes.

In the example of a photo-curable composite, the photo-curable composite may be curable with radiation 125 (e.g., curable with ultraviolet light) from a radiation source 127. In some examples, the radiation 125 may be ultraviolet light in a wavelength range of about 460 nanometers to about 470 nanometers (e.g., ultraviolet light). However, the filler material 120 may be curable by radiation at other wavelengths, such as one or more wavelengths in the visible light spectrum, infrared spectrum, microwave spectrum, etc. In some examples, ultraviolet light generated by a plasma source (e.g., used for a surface processing operation) may cure the filler material 120. After curing, in some examples, the filler material 120 may include an associated hardness, such as a hardness in a range of about 4 Mohs to about 10 Mohs, such as about 4 Mohs to about 7 Mohs, such as about 7 Mohs to about 10 Mohs.

FIG. 2B depicts providing the filler material 120 to a rough surface 112 of a semiconductor workpiece 110 where the filler material 120 remains a liquid. The liquid filler material 120 fills the deep topographical areas of at least a portion of the rough surface 112 of the semiconductor workpiece 110 as shown in FIG. 2B. In some examples, a filler material source 135 may be operable to replenish or provide the liquid filler material 120 to at least a portion of the rough surface 112 of the semiconductor workpiece 110 during the surface processing operation(s).

FIG. 2C depicts providing the filler material 120 to a rough surface 112 of a semiconductor workpiece 110 in conjunction with a scan pattern of a laser-based surface processing operation according to example embodiments of the present disclosure. More particularly, a scanning head 145 may include one or more of a filler material source 135, a curing source 127, and/or a laser source 200. As the scanning head 145 is scanned across a rough surface 112 of the semiconductor workpiece 110, the filler material source 135 may provide the filler material 120, the curing source 127 may provide a curing stimulus (e.g., radiation 125) to cure the filler material 120, and the laser source 200 may provide emission of a laser 202 to remove portions of the filler material 120 and the material of the rough surface 112 of the semiconductor workpiece 110 (e.g., silicon carbide) as described with reference to FIG. 3 below.

The scanning head 145 is illustrated in FIG. 2C as having all three of the filler material source 135, the curing source 127, and the laser source 200 for purposes of illustration and discussion. Those of ordinary skill in the art, using the disclosures provided herein, will understand that the filler material source 135, the curing source 127, and the laser source 200 may be on separate heads without deviating from the scope of the present disclosure.

The scanning head 145 may scan and provide filler material 120 to discrete portions of the semiconductor workpiece 110 in a scanning pattern. Example scanning patterns are illustrated in FIGS. 12 to 16 below.

Figure 3:
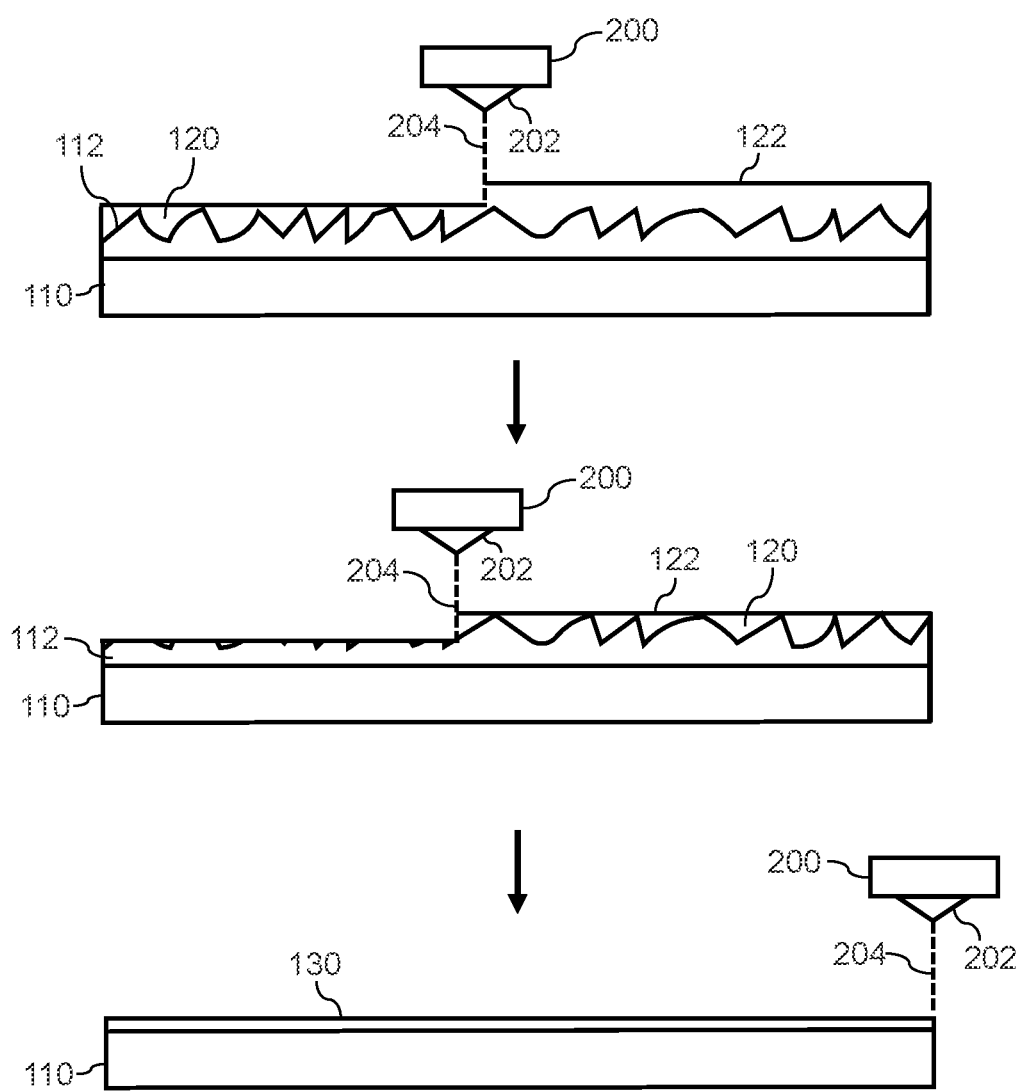
FIG. 3 depicts a cross-sectional view of an example laser-based non-planar surface processing operation according to example aspects of the present disclosure.

FIG. 3 depicts a cross-sectional view of an example laser-based non-planar surface processing operation according to example aspects of the present disclosure. The example surface processing operation may be performed on a semiconductor workpiece 110, such as a silicon carbide semiconductor wafer. The semiconductor workpiece 110 may have a rough surface 112 having a filler material 120 on the rough surface 112. The surface processing operation may be performed on a planar surface 122 to remove at least a portion of the filler material 120 and the rough surface 112 to create a planar surface 130 on the semiconductor workpiece 110.

In some examples, the surface processing operation may be performed by a laser-based surface processing system 200. As depicted in FIG. 3, the laser-based surface processing system 200 may include a laser source 202 operable to emit a laser 204 on the planar surface 122 to remove a portion of the filler material 120 and/or material of the rough surface 112 of the semiconductor workpiece 110 in one or more passes of the laser 204.

The laser 204 may be operated in accordance with one or more laser parameters. Example laser parameters are provided below:

Laser wavelength: about 190 nanometers to about 1100 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers, such as about 532 nanometers, such as about 1064 nanometers, such as about 1080 nanometers;

Laser pulse frequency: Pulse frequency: about 1 kilohertz to about 200 kilohertz, such as about 10 kilohertz to about 150 kilohertz, such as about 20 kilohertz to about 100 kilohertz or in a continuous mode (e.g., no pulses);

Laser power: 0.1 watt to about 500 watts, such as about 0.5 watt to about 100 watts, such as about 1 watt to about 40 watts, such as about 1 watt to about 10 watts;

Laser pulse duration: about 0.1 femtoseconds to about 300 nanoseconds; such as about 1 femtosecond to about 500 picoseconds, such as about 1 femtosecond to about 150 nanoseconds, such as about 1 femtosecond to about 100 nanoseconds;

Translation speed: about 1 millimeter per second to about 2 meters per second, such as about 1 millimeter per second to about 1 meter per second Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece), such as about 0 microns to about 5 microns (beneath the surface of the workpiece), such as about 0 microns to about 1 micron (beneath the surface of the workpiece).

Laser Pulse Energy: about 1 nanojoule to about 2 joule, such as about 10 nanojoules to about 200 millijoules.

In some examples, the filler material 120 may have a first removal rate for the laser-based surface processing operation. The material of rough surface 112 of the the semiconductor workpiece 110 (e.g., silicon carbide) may have a second removal rate for the laser-based surface processing operation shown in FIG. 3. The first removal rate may be within 20% of the second removal rate such that the filler material 120 and the material of the rough surface 112 of the semiconductor workpiece 110 (e.g., silicon carbide) are removed at nearly the same rate by the laser 204 during the laser-based surface processing operation. In this way, the laser-based surface processing operation may create a planar surface 130 in the semiconductor workpiece 110 by providing for uniform removal of both the filler material 120 and the material of the rough surface 112 of the semiconductor workpiece 110. Because the filler material 120 at least partially provides a planarized surface (e.g., over at least a portion of the surface 112 of the workpiece 110), the planarized surface is translated to the planar surface 130 during the laser-based non-planar surface processing operation.

In some examples, the filler material 120 may have a lower removal rate relative to the material of the rough surface 112 of the semiconductor workpiece 110 (e.g., silicon carbide) for the surface processing operation and/or may not be removed (e.g., zero removal rate) during the surface processing operation. In these examples, the surface processing operation may remove the material of the rough surface 112 of the semiconductor workpiece 110 (e.g., silicon carbide) without removing the filler material 120 and/or may remove the filler material 120 at a reduced rate). This may allow for removal of high topographical areas on the rough surface 112 of the workpiece 110 prior to removal of low topographical areas on the rough surface 112 of the semiconductor workpiece 110, leading to a more planarized surface 130 as a result of the surface processing operation. The filler material 120 can then be subsequently removed in a subsequent processing operation.

In some examples, the filler material 120 may have properties (e.g., electrostatic properties, RF absorption properties, optical properties, thermal properties, electrical properties, electrochemical properties, chemical properties, rheological properties, etc.) that alter the speed of removal of material from deep topographical areas relative to higher topographical areas on the rough surface 112 of the semiconductor workpiece 110 that are covered by or include less filler material 120 or no filler material 120. For instance, in the example of a laser-based surface processing operation, the filler material 120 may include an optical property (e.g., refractive index, transmissivity, reflectivity, etc.) that changes the application of a laser to a rough surface 112 of the semiconductor workpiece 110 (e.g., change the focal depth, scatter the laser, reduce laser pulse energy, etc.). In this way, the filler material 120 may slow down or otherwise affect laser ablation of deep topographical areas relative to other areas on the rough surface 112 of the semiconductor workpiece 110.

For instance, in the example of a plasma-based or sputtering-based surface processing operation, the filler material 120 may include thermal or RF absorption properties that change the removal rate of a plasma or sputtering process to a surface of the semiconductor workpiece. In this way, the filler material 120 may slow down or otherwise affect plasma or refractive ion etching rates of deep topographical areas relative to other areas on the semiconductor workpiece 110. As another example, the filler material 120 may include one or more properties that affect the removal rate of an etching process (e.g., plasma-based etch process and/or a wet etch process) at deep topographical areas relative to other areas on the semiconductor workpiece 110.

Figure 4:
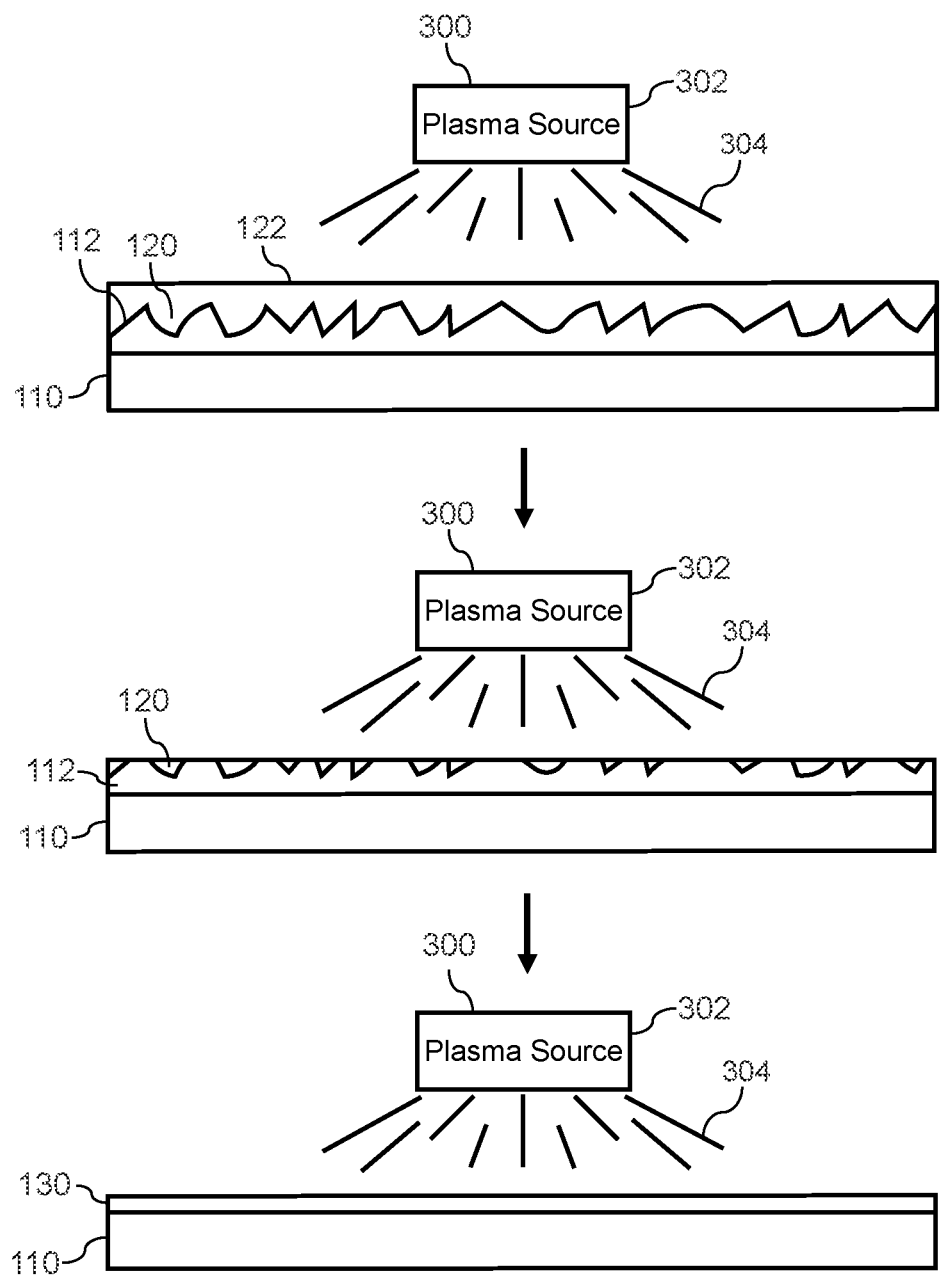
FIG. 4 depicts a cross-sectional view of an example plasma-based non-planar surface processing operation according to example aspects of the present disclosure.

FIG. 4 depicts a cross-sectional view of an example plasma-based non-planar surface processing operation according to example aspects of the present disclosure. The example plasma-based surface processing operation may be performed on a semiconductor workpiece 110, such as a silicon carbide semiconductor wafer. The semiconductor workpiece 110 may have a rough surface 112 having a filler material 120 on the rough surface 112. The plasma-based surface processing operation may be performed on the planar surface 122 to remove at least a portion of the filler material 120 and the rough surface 112 to create a planar surface 130 on the semiconductor workpiece 110.

In some examples, the surface processing operation may be performed by a plasma-based surface processing system 300. As depicted in FIG. 4, the plasma-based surface processing system 300 may include a plasma source 302 (e.g., one or more inductively coupled plasma sources, capacitively coupled plasma sources, helicon wave plasma sources, or other plasma sources) operable to generate a plasma 304 (e.g., from a reactive process gas) to implement a removal process (e.g., etch process) on the planar surface 122 to remove a portion of the filler material 120 and/or material of the rough surface 112 of the semiconductor workpiece 110. In some examples, radiation associated with the plasma (e.g., ultraviolet light) may be used to cure the filler material 120 on the semiconductor workpiece 110.

In some examples, the filler material 120 may have a first removal rate for the plasma-based surface processing operation. The material of the rough surface 112 of the semiconductor workpiece 110 (e.g., silicon carbide) may have a second removal rate for the plasma-based surface processing operation shown in FIG. 4. The first removal rate may be within 20% of the second removal rate such that the filler material 120 and the material of the rough surface 112 of the semiconductor workpiece 110 (e.g., silicon carbide) are removed at nearly the same rate by the plasma 304 during the plasma-based surface processing operation. In this way, the non-planar plasma-based surface processing operation may create a planar surface 130 in the semiconductor workpiece 110 by providing for uniform removal of both the filler material 120 and the material of the rough surface 112 of the semiconductor workpiece 110. Because the filler material 120 at least partially provides a planarized surface (e.g., over at least a portion of the rough surface 112 of the workpiece 110), the planarized surface is translated to the planar surface 130 during the plasma-based non-planar surface processing operation.

In some examples, the filler material 120 may have a lower removal rate relative to the material of the rough surface 112 of the semiconductor workpiece 110 (e.g., silicon carbide) for the surface processing operation and/or may not be removed (e.g., zero removal rate) during the surface processing operation. In these examples, the surface processing operation may remove the material of the rough surface 112 of the semiconductor workpiece 110 (e.g., silicon carbide) without removing the filler material 120 and/or may remove the filler material 120 at a reduced rate). This may allow for removal of high topographical areas on the surface of the workpiece 110 prior to removal of low topographical areas on the surface of the workpiece 110, leading to a more planarized surface 130 as a result of the surface processing operation. The filler material 120 can then be subsequently removed in a subsequent processing operation.

In some examples, the filler material 120 may have properties (e.g., optical properties, thermal properties, electrochemical properties, rheological properties, etc.) that alter the speed of removal of material from deep topographical areas relative to higher topographical areas on the rough surface 112 of the semiconductor workpiece 110 that are covered by or include less filler material 120 or no filler material 120. For instance, in the example of a laser-based surface processing operation, the filler material 120 may include optical properties (e.g., refractive index, transmissivity, reflectivity, etc.) that change the application of a laser to a rough surface 112 of the semiconductor workpiece 110 (e.g., change the focal depth, scatter the laser, reduce laser pulse energy, etc.). In this way, the filler material 120 may slow down or otherwise affect laser ablation of deep topographical areas relative to other areas on the rough surface 112 of the semiconductor workpiece 110. As another example, the filler material 120 may include one or more properties that affect the removal rate of an etching process (e.g., plasma-based etch process, sputtering process, and/or a wet etch process) at deep topographical areas relative to other areas on the rough surface 112 of the semiconductor workpiece 110.

In some examples, the surface processing system 300 may be a plasma etching device. The plasma etching device may generate a plasma that etches and removes the filler material 120 and rough surface 112 from the semiconductor workpiece 110 leaving the planar surface 130. In some examples with a plasma etching device, the generated plasma may cure the filler material 120 as it creates the planar surface 130.

In some examples, the plasma etching process may use one or more different etch processes (e.g., different plasma-based etch processes, sputtering processes, and/or wet etch processes) that are pulsed or alternated to control the removal of the material of the rough surface 112 of the semiconductor workpiece 110 (e.g., silicon carbide) and the filler material 120 independently. For instance, a first etch process may be used to primarily remove the material of the rough surface 112 of the semiconductor workpiece 110. A second etch process may be used to primarily remove the filler material 120. The first etch process and the second etch process may be alternated to planarize the rough surface 112 of the semiconductor workpiece 110.

FIG. 4 is discussed with a plasma-based etch process for purposes of illustration and discussion. Those of ordinary skill in the art, using the disclosures provided herein, will understand that wet etch processes, sputtering processes, or combined wet etch, plasma-based, and/or sputtering processes may similarly be used without deviating from the scope of the present disclosure.

Figure 5:
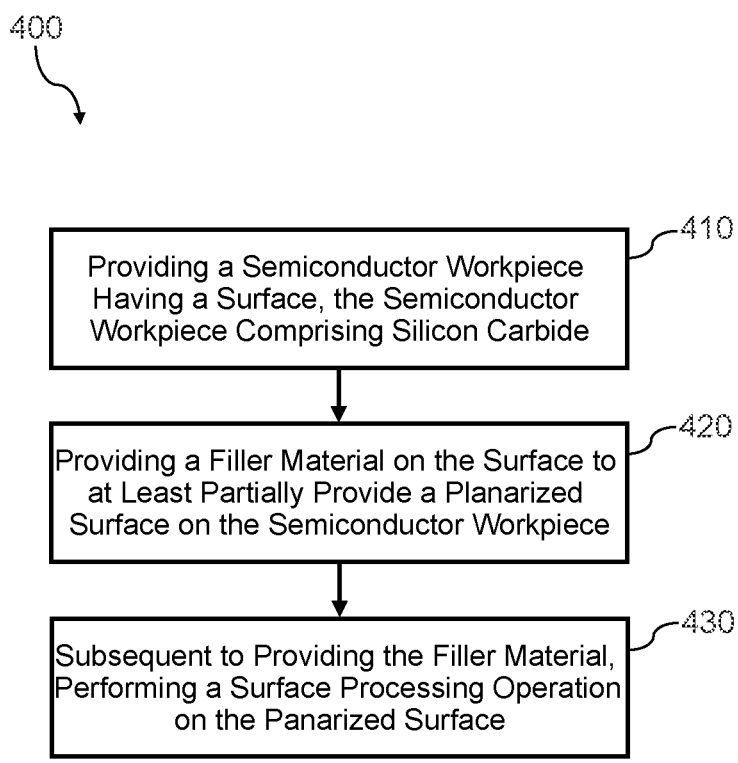
FIG. 5 depicts a flow diagram of a method according to example aspects of the present disclosure.

FIG. 5 depicts a flow diagram of a method 400 according to example aspects of the present disclosure. The method 400 depicts operations performed in a particular order for purposes of illustration and discussion. Those of ordinary skill in the art, using the disclosures provided herein, will understand that the operations of any of the methods described herein may be adapted, expanded, performed simultaneously, omitted, rearranged, include steps not illustrated, and/or modified in various ways without deviating from the scope of the present disclosure.

At 410, the method 400 includes providing a semiconductor workpiece having a surface. In some examples, the semiconductor workpiece may include silicon carbide. In some examples, the semiconductor workpiece may be a semiconductor wafer and may have an associated surface roughness greater than about 10 microns, such as greater than about 50 microns, such as greater than about 65 microns.

At 420, the method 400 includes providing a filler material on at least a portion of the surface to at least partially provide a planarized surface on the semiconductor workpiece (e.g., the filler material is on at least a portion of the surface of the semiconductor workpiece). In some examples, the planarized surface may be identified by an associated surface roughness that is less than the surface roughness of the surface of the semiconductor workpiece prior to providing the filler material. In some examples, the planarized surface has a surface roughness of less than about 65 microns, such as less than about 50 microns, such as less than about 10 microns, such as less than about 1 micron, such as less than about 500 nanometers, such as less than about 100 nanometers, such as in a range of about 0.5 nanometers to about 180 nanometers, such as in range of about 180 nanometers to about 1 micron, such as in a range of about 1 micron to about 10 microns, such as in a range of about 1 micron to about 65 microns.

In some examples, the filler material may be a sol-gel defined liquid. In some examples, the filler material may be a spin-coatable glass. In some examples, the filler material may be a ceramic composite. In some examples, the filler material may be or include organosilicone, such as tetraethyl orthosilicate (TEOS), tetramethylcyclotetra-siloxane (TMCTS), polydimethylsiloxane (PDMS), cyclic siloxanes, or related compounds. In some examples, the filler material may be a hydrate with a metal oxide precursor (e.g., $ZnOxH_2O$) or nitrate precursor (e.g., $Ga(NO_3)_3xH_2O$). While example filler materials have been discussed herein, it should be appreciated that any sol gel processes that create liquid processable materials with properties required for a selected surface removal process may be used as a filler material according to the present disclosure.

In some examples, the filler material may be a non-sol gel material that may fill the substrate surface topography. For instance, the filler material may be a curable liquid composite that may be engineered to fill voids, adhere to surfaces, and be curable into a hard solid through a curing process via exposure to radiation (e.g., visible light or UV light). In some examples, the filler material may be cured through any suitable curing processes, such as photo curing, thermal curing, chemical curing, microwave absorption curing, pressure curing, ambient curing, electrochemical curing, or other suitable curing processes.

As an example, the filler material may be a photo-curable resin-based composite (PCRB). Suitable PCRB's may be a mixture of photopolymerizable monomers, photoactive polymerization initiators, and a surface functionalized filler (SFF).

In some examples, the PCRB may include a resin binder with a mixture of two methacrylate terminated monomers that may include, for instance, a base monomer and diluent monomer. Example base monomers may include, for instance, bisphenol A glycol dimethacrylate (Bis-GMA), ethoxylated bisphenol A glycol dimethacrylate (Bis-EMA), or urethane dimethacrylate (UDMA). Example dilutant monomers may include, for instance, triethylene glycol dimethacrylate (TEDGMA), decanediol dimethacrylate (D3MA), or 2-hydroxyethyl methacrylate (HEMA). Filler materials that include a PCRB with a resin binder may be curable using a free radical initiator. Example free radical initiators may include a camphorquinone mixed with an amine photo-polymerization accelerator such as ethyl 4-(dimethylamino)benzoate, N,N-dimethylaminoethyl methacrylate, 2-ethyl-dimethylbenzoate, N,N-dimethyl-p-toluidine, or N-phenylglycine.

In some examples, the SFFs in the PCRB may include microparticles or nanoparticles of, for instance, ceramics, inorganic compounds, metals, metalloids, minerals, non-metallic elements, inorganic-inorganic hybrid materials, inorganic-inorganic composites, organic compounds, organic-inorganic hybrid materials, organic-inorganic composites, or similar materials. The surface functionalized fillers may include microparticles or nanoparticles with matched properties to a semiconductor wafer material and surface removal process. In some example SFFs, compounds may be used to functionalize the surface of the particles, promote dispersion and couple to the resin matrix during curing of a PCRB. In some examples, these compounds may include 10-methacryloyloxydecyl dihydrogen phosphate, dipentaerythritol penta-acrylate phosphate, thiourethane oligomers, or similar materials.

At 430, the method 400 includes, subsequent to providing the filler material, performing a surface processing operation on the planarized surface. In some examples, the surface processing operation may include a selectivity such that a first removal rate of the semiconductor workpiece is substantially similar to a second removal rate associated with the filler material, such as within about 20%.

For instance, the semiconductor workpiece may be subjected to a planar surface processing operation and/or a non-planar surface processing operation. Example planar surface processing operations may include providing the surface of the workpiece against a planar surface (e.g., with or without a slurry), such as a polishing pad, grind disc, grinding teeth on a grind wheel, etc. Example non-planar surface processing operations do not expose the surface of the workpiece to a planar surface. Example non-planar surface processing operations may include, for instance, laser-based surface processing operations, reactive ion etching (RIE) based surface processing operations, plasma-based surface processing operations, sputtering-based surface processing operations, and/or wet etch-based surface processing operations. In example embodiments that use a plasma-based surface processing operation the plasma generated during the plasma-based surface processing operation may generate radiation to cure the filler material on the semiconductor workpiece.

Figure 6:
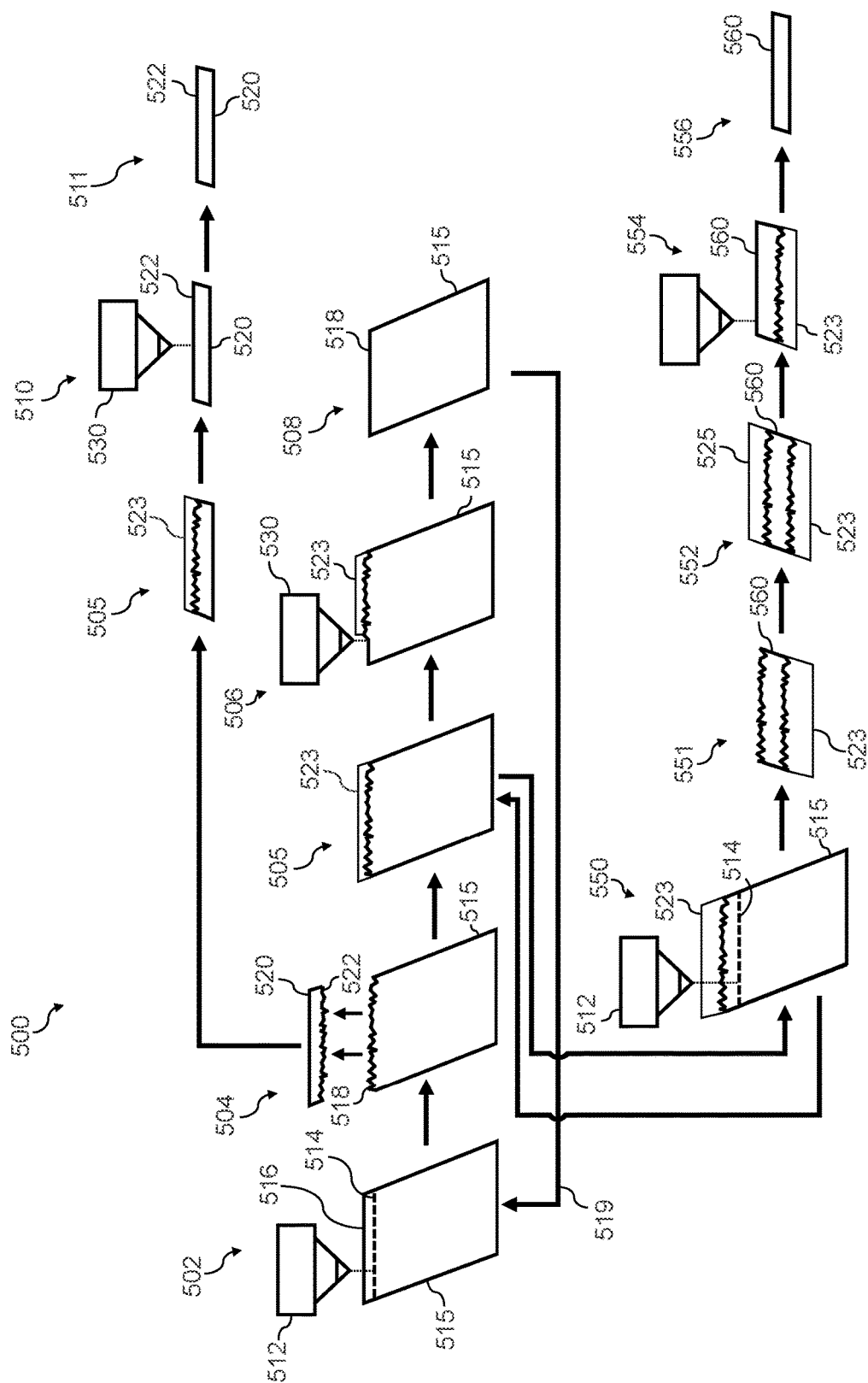
FIG. 6 depicts an overview of an example method according to example embodiments of the present disclosure.

FIG. 6 depicts an overview of an example method 500 according to example embodiments of the present disclosure. FIG. 6 is intended to represent structures for identification and description and is not intended to represent the structures to physical scale. The method 500 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 502, the method 500 may include performing a removal process on a boule 515 (e.g., a laser-based removal process, saw-based removal process, etc.). For instance, in some examples one or more laser sources 512 may be operated according to one or more laser parameters to induce a subsurface laser damage region 514 in the boule 515.

In some examples, the laser source 512 may be operated in accordance with certain laser parameters to induce the subsurface laser damage region 114 in the boule 115. For instance, in certain examples, a laser having a wavelength of in a range about 800 nanometers to about 1100 nanometers may be used to implement the laser-based removal process. Although a wide range of pulse frequencies may be used in certain embodiments, pulse frequencies of 120 kilohertz to 150 kilohertz may be employed in the laser-based removal process. A translation speed in a range of about 500 millimeters per second to about 3000 millimeters per second between a laser emission and a boule 115 may be used. However, higher or lower translation stage speeds may be used in certain embodiments with suitable adjustment of laser frequency to maintain desirable laser pulse overlap. Average laser power ranges for forming subsurface laser damage 514 may be in a range of from about 0.5 watt to about 10 watts for silicon carbide. Laser pulse energy may be calculated as power divided by frequency. Laser pulse widths of about 1 nanosecond to about 10 nanoseconds may be used, although other pulse widths may be used in other embodiments. Referring to FIG. 6 at 504, the method 500 may include separating a semiconductor wafer 520 from the boule 515 along the subsurface laser damage region 514. Removing the wafer 520 from the boule 515 may be performed through a variety of methods. For instance, a mechanical fracturing process may be used to fracture and separate the semiconductor wafer 520 from the boule 515. FIG. 6 illustrates a laser-based removal process for purposes of illustration and discussion. Those of ordinary skill in the art, using the disclosures provided herein, will understand that other removal processes may be used without deviating from the scope of the present disclosure.

In some instances, separating the wafer 520 from the boule 515 may leave rough exposed surfaces on both the semiconductor wafer 520 and the boule 515. For instance, the semiconductor wafer 520 may have an exposed surface 522 with large surface roughness, such as a surface roughness greater than about 65 microns. Similarly, the boule 515 may have an exposed surface 518 with large surface roughness, such as a surface roughness greater than about 65 microns.

At 505, the method 500 may include applying a filler material 523 to the exposed surface 518 of the boule 515 and/or the exposed surface 522 of the semiconductor wafer 520. The filler material 523 may fill the valleys and cover the peaks on the rough surface 518, 522 created by the separation process at 504. Example filler materials 523 are described in detail above.

One or more planar and/or non-planar surface processing operations may be used to smooth the exposed surface 518 of the boule 515 and/or the exposed surface 522 of the semiconductor wafer 520. In the example of FIG. 6, the method may include, at 506, ablating the exposed surface 518 of the boule 515 using one or more lasers of a laser system 530 to remove the filler material 523 and/or semiconductor material (e.g., silicon carbide) from the exposed surface 518. As shown at 510, the method may include ablating the exposed surface 522 of the semiconductor wafer 520 using one or more lasers of a laser system 530 to remove the filler material 523 and/or semiconductor material (e.g., silicon carbide) from the exposed surface 522. However, other suitable planar surface processing operations and/or non-planar surface processing operations may be used without deviating from the scope of the present disclosure.

The surface processing operation 506 may result in a planarized exposed surface 518 of the boule 515 as shown at 508 of the method 500. As a result, the boule 515 may be suitable for subsequent removal process(es) as indicated by arrow 519. The surface processing operation 510 may result in a planarized exposed surface 522 of the semiconductor wafer 520 as shown at 511. As a result, the semiconductor wafer 520 may be suitable for subsequent processing operations for fabrication of semiconductor devices on the semiconductor wafer 520. The subsequent processing operations may include one or more of, for instance, grinding processes (e.g., coarse grinding, fine grinding), laser-based surface processing operations, additional fill-in planarization processes, plasma-based operations, sputtering operations, wet etch operations, etc. A variety of subsequent processing operations may be performed without deviating from the scope of the present disclosure.

In some examples, after applying the filler material 523 to the boule 515 as shown as 505, the method 500 can include conducting another removal process 550 on the boule 515 with the filler material 523 as shown at 550. In examples where the removal process is a laser-based removal process, the filler material 523 may be transparent to the laser used in the laser-based removal process.

As shown at 551, the removal process at 550 may result in a semiconductor wafer 560 that may be mechanically supported by the filler material 523 as a carrier substrate as described in detail with reference to FIG. 7 below. At 552, a second layer of filler material 525 may be applied to a surface of the semiconductor wafer 560. As shown at 554, the method may include ablating the exposed surface 522 of the semiconductor wafer 560 using one or more lasers of a laser system 530 to remove the filler material 525 and/or the material from the exposed surface 522 of the semiconductor wafer 560. At 556, the filler material 523 and/or material from the exposed surface 522 of the semiconductor wafer 560 may be removed using subsequent surface processing operations (e.g., planar and/or non-planar) to yield a semiconductor wafer 560 with planarized surfaces.

Figure 7:
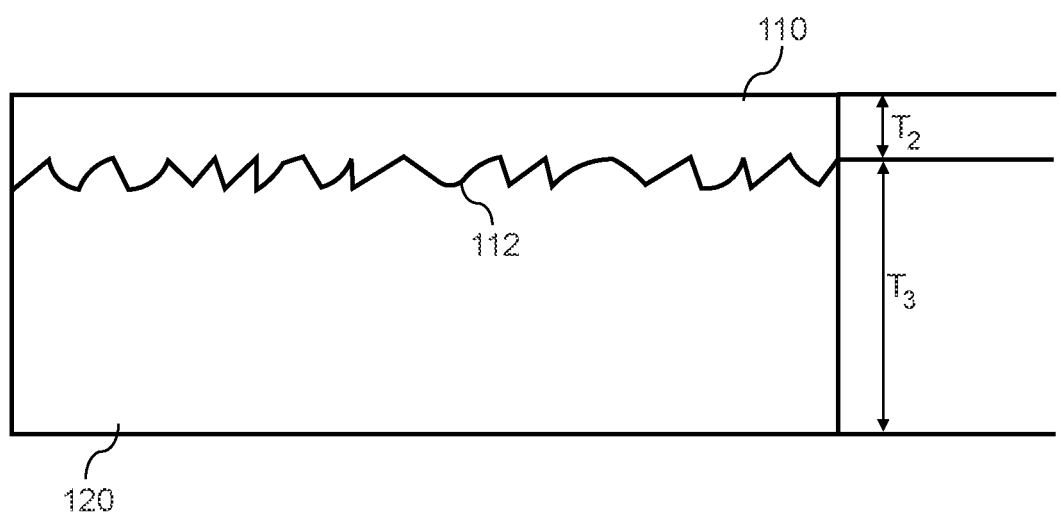
FIG. 7 depicts an example semiconductor workpiece assembly having a filler material acting as a carrier substrate for a semiconductor workpiece according to example embodiments of the present disclosure.

FIG. 7 depicts an example semiconductor workpiece assembly having a filler material 120 acting as a carrier substrate for a semiconductor workpiece 110 according to example embodiments of the present disclosure. More particularly, the semiconductor workpiece assembly may include the semiconductor workpiece 110 (e.g., the semiconductor wafer 520 removed from the boule 515 in FIG. 6). The semiconductor workpiece 110 may be, for instance, a silicon carbide semiconductor wafer. The semiconductor workpiece 110 may have a rough surface 112 as a result of, for instance, a removal process. The semiconductor workpiece 110 may have a thickness T2 in a range of, for instance, less than about 500 microns, such as less than about 300 microns, such as less than about 200 microns, such as in a range of about 80 microns to about 280 microns, such as in a range of about 120 microns to 180 microns.

The semiconductor workpiece assembly may include a filler material 120 on the semiconductor workpiece 110. The filler material 120 may be or may include one or more of any of the filler materials described in the present disclosure. The filler material 120 may act as a carrier substrate for the semiconductor workpiece 110.

In some examples, the filler material 120 may be cured so as to provide sufficient structural support for the semiconductor workpiece 110. For instance, the filler material 120 may have a modulus of elasticity, after curing, of greater than about 20 gigapascals, such as in a range of about 20 gigapascals to about 400 gigapascals, such as in a range of 100 gigapascals to about 400 gigapascals.

The filler material 120 may have a thickness T3 that is greater than a thickness T2 of the semiconductor workpiece 110. For instance, the filler material 120 may have a thickness T3 of about 100 microns or greater, such as about 150 microns or greater, such as about 200 microns or greater, such as about 500 microns or greater, such as about 1000 microns or greater, such as about 200 microns to about 1000 microns, such as about 500 microns to about 1000 microns. In some examples, the thickness T3 is in a range of 100 microns to 1500 microns. The filler material 120 can act as a carrier substrate for the semiconductor workpiece 110. In this way, the semiconductor workpiece 110 may be handled and processed via the carrier substrate made at least partially from the filler material 120.

Figure 8:
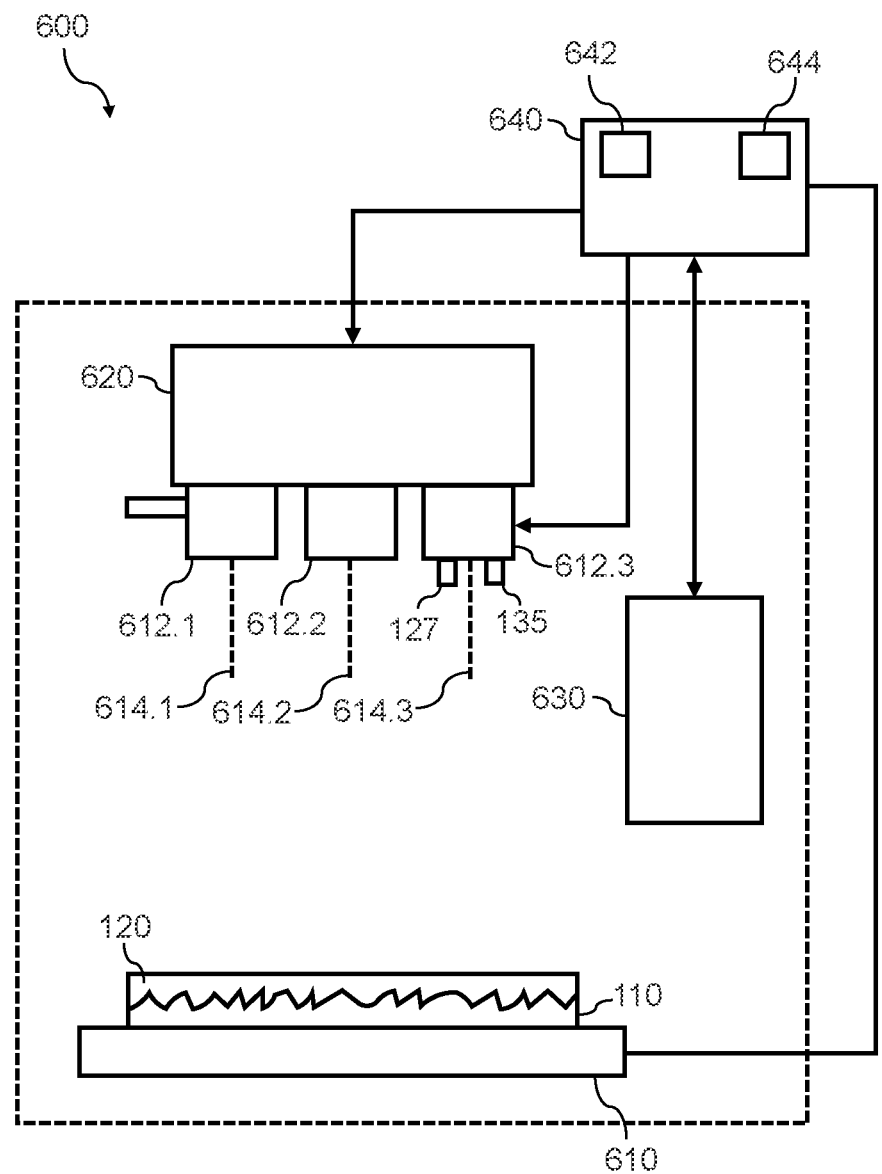
FIG. 8 depicts a laser processing apparatus according to example aspects of the present disclosure.

FIG. 8 depicts an example laser processing system 600 that may be configured to implement a laser-based non-planar surface processing operation on a semiconductor workpiece 110 with a filler material 120 according to examples of the present disclosure. The laser processing system 600 may be configured to implement one or more aspects of the present disclosure, such as the laser-based removal processes, laser-based surface processing operations, and/or laser filler application processes s disclosed herein.

The laser processing system 600 includes one or more laser sources 612.1, 612.2, 612.3, . . . , 612.$n$. The one or more laser sources 612.1, 612.2, 612.3, . . . , 612.$n$ may each be configured to respectively emit a laser 614.1, 614.2, 614.3, . . . , 614.$n$ in accordance with various laser parameters. The laser parameters may include, for instance, focusing depth, laser power, laser wavelength, laser pulse frequency, laser pulse duration, laser pulse frequency, laser pulse energy, etc.

The laser sources 612.1, 612.2, 612.3, . . . , 612.$n$ may each be associated with one or more wavelengths and may be, for instance, one or more of a excimer laser, UV laser, visible light laser, infrared laser, single wavelength laser, multiwavelength laser, white laser, etc. The laser sources 612.1, 612.2, 612.3, . . . , 612.$n$ may each be associated with a pulse duration and may be, one or more of an attosecond laser, femtosecond laser, nanosecond laser, etc. The laser sources 612.1, 612.2, 612.3, . . . , 612.$n$ may each be associated with a lasing medium and may be, for instance, a gas (e.g., $CO_2$) laser, solid state laser (e.g., GaN, AlGaN, YAG, etc.), diode laser, fiber laser, etc. The laser sources 612.1, 612.2, 612.3, . . . 612.$n$ may be one or more of a single frequency laser, frequency doubled laser, frequency tripled laser, frequency quadrupled laser, etc.

The laser sources 612.1, 612.2, 612.3, . . . , 612.$n$ may each be the same type of laser source or different types of laser sources. The laser sources 612.1, 612.2, 612.3, . . . , 612.$n$ may be configured to emit lasers 614.1, 614.2, 614.3, . . . , 614.$n$ in accordance with the same laser parameters or different laser parameters.

For instance, in some embodiments, the laser processing system 600 may include a first laser source 612.1, a second laser source 612.2, and a third laser source 612.3. The first laser source 612.1 may be operable to emit a laser 614.1 with laser parameters sufficient to perform a laser-based removal process, such as the laser-based removal process shown at 502 of FIG. 6 and 550 of FIG. 6. The second laser source 612.2 may be operable to emit a laser 614.2 with laser parameters sufficient to perform, for instance, a laser ablation process. In some embodiments, the second laser source 612.2 may be an infrared laser source configured to emit an infrared laser. In some embodiments, the second laser source 612.2 may be configured to emit a laser 614.2 in accordance with the following laser parameters:

- Laser wavelength: about 500 nanometers to about 1100 nanometers, such as about 532 nanometers, such as about 1064 nanometers, such as about 1080 nanometers;
- Laser pulse frequency: about 1 kilohertz to about 200 kilohertz, such as about 10 kilohertz to about 150 kilohertz, such as about 20 kilohertz to about 100 kilohertz;
- Laser power: 0.1 watt to about 500 watts, such as about 0.5 watt to about 100 watts, such as about 1 watt to about 40 watts, such as about 1 watt to about 10 watts;
- Laser pulse duration: about 0.1 femtoseconds to about 300 nanoseconds; such as about 1 femtosecond to about 150 nanoseconds, such as about 1 femtosecond to about 100 nanoseconds;
- Translation speed: about 1 millimeter per second to about 2 meters per second, such as about 1 millimeter per second to about 1 meter per second
- Focusing depth: about 0 microns to about 2000 microns (beneath the surface of the workpiece), such as about 0 microns to about 1000 microns (beneath the surface of the workpiece), such as about 1 micron to about 100 microns (beneath the surface of the workpiece).
- Laser Pulse Energy: about 1 nanojoule to about 2 joules, such as about 10 nanojoules to about 200 millijoules.

The third laser source 612.3 may be configured to emit a laser 614.3 with laser parameters sufficient to perform a fine laser ablation process. In some embodiments, the third laser source 612.3 may be an ultraviolet laser source configured to emit an ultraviolet laser. In some embodiments, the third laser source 612.3 may be configured to emit a laser 614.3 in accordance with the following laser parameters:

- Laser wavelength: about 190 nanometers to about 600 nanometers, such as about 190 nanometers to about 300 nanometers, such as about 193 nanometers, such as about 200 nanometers, such as about 248 nanometers, such as about 266 nanometers, such as about 343 nanometers, such as about 355 nanometers, such as about 405 nanometers;
- Laser pulse frequency: about 1 kilohertz to about 200 kilohertz, such as about 1 kilohertz to about 150 kilohertz, such as about 1 kilohertz to about 100 kilohertz, such as about 1 kilohertz to about 50 kilohertz;
- Laser power: 0.1 watt to about 10 watts, such as about 0.5 watt to about 10 watts, such as about 1 watt to about 10 watts;
- Laser pulse duration: about 0.1 femtoseconds to about 1 nanoseconds; such as about 1 femtosecond to about 500 picoseconds;
- Translation speed: about 1 millimeter per second to about 2 meters per second, such as about 1 millimeter per second to about 1 meter per second
- Focusing depth: about 0 microns to about 10 microns (beneath the surface of the workpiece), such as about 0 microns to about 5 microns (beneath the surface of the workpiece), such as about 0 microns to about 1 micron (beneath the surface of the workpiece);
- Laser Pulse Energy: about 1 nanojoule to about 2 joule, such as about 10 nanojoules to about 200 millijoules.

FIG. 8 depicts three laser sources 612.1, 612.2, 612.3 for purposes of illustration and discussion. Those of ordinary skill in the art, using the disclosures provided herein, will understand that the system 600 may include more or fewer laser sources without deviating from the scope of the present disclosure and may, in some examples, include additional laser sources, electromagnetic sources, and/or radiative sources to treat or cure the filler material or treat the semiconductor workpiece. For instance, the system 600 may include a plurality of first laser sources 612.1 operable to emit a laser 614.1 with laser parameters sufficient to perform a laser-based removal process. The system 600 may include a plurality of second laser sources 612.2 operable to emit a laser 614.2 with laser parameters sufficient to perform a coarse laser ablation process. The system 600 may include a plurality of third laser sources 612.3 operable to emit a laser 614.3 with laser parameters sufficient to perform a fine laser ablation process.

The system 600 may include one or more additional laser sources or different radiative sources to provide different functionality. In some examples, the system 600 may include one or more laser sources operable to scribe a fiducial workpiece mark or ID mark on the workpiece. In some examples, the system 300 may include one or more laser sources configured to singulate or cut (e.g., dicing (a plurality of semiconductor dice from the workpiece. In some examples, the system 600 may include one or more laser source(s) configured to obtain metrology (e.g., surface topography) measurements of a semiconductor workpiece 110. In some examples, the system 600 may include one or more additional laser sources or different radiative sources to intentionally create patterned surface on the workpiece (e.g., for fiducial marking, dicing, etc.).

In some embodiments, one or more of the laser sources 612.1, 612.2, 612.3, ..., 612.*n* may include, for instance, a filler material source 135 and/or a curing source 127. The curing source may be any suitable source to provide a curing stimulus, such as an optical source (e.g., laser, blue LED, UV LED), electrochemical source, thermal source, radiation source, microwave source, plasma source, electromagnetic source, etc. More particularly, the system 600 may include a scanning head 145 and may include one or more of a filler material source 135, a curing source 127, and/or one of the laser sources 612.1, 612.2, 612.3, ..., 612.*n*. As the scanning head 145 is scanned across an exposed surface 112 of the semiconductor workpiece 110, the filler material source 135 may provide the filler material, the curing source 127 may provide a curing stimulus to cure the filler material 120, and the laser source 612.1, 612.2, 612.3, ..., 612.*n*. may provide emission of a laser 614.1, 614.2, 614.3, ..., 614.*n* to remove portions of the filler material 120 and the exposed surface 112 material of the semiconductor workpiece 110 (e.g., silicon carbide) as described herein.

FIG. 8 depicts the curing source 127 and the filler material source 135 as part of laser source 612.3 for purposes of illustration. Those of ordinary skill in the art, using the disclosures provided herein, will understand the curing source 127 and/or filler material source 135 may be part of the one or more laser sources 612.1, 612.2, 612.3, ..., 612.*n* or may be standalone components within the system 600.

The system 600 includes a workpiece support 610 configured to support a semiconductor workpiece 110 with filler material 120. The workpiece support 610 may include a chuck (e.g., vacuum chuck, electrostatic chuck) or other mechanism to hold the semiconductor workpiece 110 in place during laser processing according to examples of the present disclosure.

The one or more laser sources 612.1, 612.2, 612.3, ..., 612.n may be coupled to a translation stage 620 that may move the one or more laser sources 612.1, 612.2, 612.3, ..., 612.n relative to the semiconductor workpiece 110. In addition, the laser sources 612.1, 612.2, 612.3, ..., 612.n and/or translation stage 620 may include one or more optics (e.g., lens, mirrors, etc.) to facilitate moving the lasers 614.1, 614.2, 614.3, ..., 614.n from the laser sources 612.1, 612.2, 612.3, ..., 612.n relative to the semiconductor workpiece 110. In addition, or in the alternative, the workpiece support 610 may be operable to move the semiconductor workpiece 110 relative to the one or more lasers 612. In this way, the system 600 may be able to control the translation stage 620 and/or the workpiece support 610 to impart relative motion between the lasers 614.1, 614.2, 614.3, ... 614.n and the workpiece 110 to implement laser-based removal processes and/or laser ablation processes according to examples of the present disclosure.

In some embodiments, the laser processing system 600 may additionally include one or more sensors 630 for obtaining data associated with the workpiece 110, such as workpiece property data for the semiconductor workpiece 110. The workpiece property data may include, for instance, data associated with a surface of the workpiece (e.g., topography, roughness), subsurface regions of the workpiece, optical properties of the workpiece (e.g., absorption, transmissivity, reflectivity, etc.), temperature of the semiconductor workpiece 110, doping level of the workpiece, polytype of the workpiece (e.g., 4H, 6H), or other parameters.

In some embodiments, the one or more sensors 630 may include, for instance, an optical sensor, such as an image capture device (e.g., camera) that may capture images at one or more wavelengths of visible light and/or ultraviolet light or infrared light. In some embodiments, the one or more sensors 630 may include one or more surface measurement lasers that may be operable to emit a laser onto the surface of the workpiece 110 and scan the surface (based on reflections of the laser) for depth measurements, topography measurements, etc. of the surface of the semiconductor workpiece 110. Other suitable sensors may be used without deviating from the scope of the present disclosure.

The laser processing system 600 includes one or more control devices, such as a controller 640. The controller 640 may include one or more processors 642 and one or more memory devices 644. The one or more memory devices 644 may store computer-readable instructions that when executed by the one or more processors 642 cause the one or more processors 642 to perform one or more control functions, such as any of the functions described herein. The controller 640 may be in communication with various other aspects of the laser processing system 600 through one or more wired and/or wireless control links. The controller 640 may send control signals to the various components of the laser processing system 600 (e.g., the laser sources 612.1, 612.2, 612.3, ..., 612.n, the workpiece support 610, the sensor 630) to implement a laser processing operation on the semiconductor workpiece 110.

In some embodiments, the controller 640 may control aspects of the laser processing system 600 (e.g., the laser sources 612.1, 612.2, 612.3, ..., 612.n) based at least in part on data from the sensor(s) 630. For instance, the controller 640 may adjust various laser parameters for lasers 614.1, 614.2, 614.3, ..., 614.n emitted by the laser sources 612.1, 612.2, 612.3, ..., 612.n based at least in part on data from the sensor(s) 630. The laser parameters may include, for instance, one or more of focusing depth, laser power, laser wavelength, laser pulse duration, laser pulse frequency, laser pulse energy, translation speed. In some embodiments, the laser parameters may include incidence angle of the lasers 614.1, 614.2, 614.3, ..., 614.n on the semiconductor workpiece 110. For instance, the controller 640 may be configured to adjust one or more of the aspects of the laser processing system 600 to adjust the incidence angle of at least one of the one or more lasers 614.1, 614.2, 614.3, ..., 614.n relative to the surface of the semiconductor workpiece 110.

In some embodiments, the laser sources 612.1, 612.2, 612.3, ..., 612.n may include an adaptive optics system that may include one or more lenses, mirrors, or other optical devices. The lenses, mirrors, or other optical devices may be moved or adjusted to adjust one or more of the one or more laser parameters. For instance, the one or more lenses may be swapped or adjusted to change a focal depth of the lasers 614.1, 614.2, 614.3, ..., 614.n.

In some examples, the controller 640 may be configured to adjust one or more laser parameters based on sensor data associated with a current semiconductor workpiece 110 undergoing a laser-based surface processing operation (e.g., dynamic adjustment during or after a laser-based surface processing operation) or based on sensor data associated with past semiconductor workpieces that have previously undergone a laser-based surface processing operation.

In some examples, the laser sources 612.1, 612.2, 612.3, ..., 612.n may be dynamically adjusted, or tuned, during a laser surface processing operation. The one or more sensors 630 may provide sensor data to the controller 640 and the controller 640 may determine, or adjust, one or more laser parameters for the lasers 614.1, 614.2, 614.3, ..., 614.n based on the sensor data while performing the laser surface processing operation. For instance, the one or more sensors 630 may provide a surface topography of the semiconductor workpiece 110 to the controller 640 while the lasers 614.1, 614.2, 614.3, ..., 614.n is processing the surface 112 of the semiconductor workpiece 110. The controller 640 may then adjust one or more laser parameters of the lasers 614.1, 614.2, 614.3, ..., 614.n based on the received surface topography while the laser emissions 614.1, 614.2, 614.3, ..., 614.n are still processing the surface of the workpiece 110. In this way, the one or more laser parameters may be dynamically adjusted, or tuned, during laser surface processing operations.

In some examples, the one or more laser parameters of the laser sources 612.1, 612.2, 612.3, ..., 612.n may be adaptively tuned, or adjusted, through multiple laser surface processing operations. The one or more sensors 630 may aggregate data regarding the semiconductor workpiece 110 (e.g., workpiece property data) before, during, and after a laser surface processing operation and provide it to the controller 640. The controller 640 may then tune one or more laser parameters of the laser sources 612.1, 612.2, 612.3, ..., 612.n based on the aggregated data from the one or more sensors 630 or other data (e.g., from metrology). For instance, the laser sources 612.1, 612.2, 612.3, ..., 612.n may include a set of one or more laser parameters for a laser surface processing operation. The laser sources 612.1, 612.2, 612.3, ..., 612.n may perform a laser surface processing operation on the surface of a semiconductor workpiece 110 and the one or more sensors 630 may obtain workpiece property data after the operation. The workpiece property data may then be provided to the controller 640 which may adjust, or tune, one or more of the set laser parameters associated with the laser sources 612.1, 612.2, 612.3, . . . , 612.n and reprocess the surface of the semiconductor workpiece 110. In some examples, the one or more laser parameters may be adaptively tuned for future laser surface processing operations and/or future additional semiconductor workpiece(s) 110. For instance, the controller 640 may determine one or more laser parameter adjustments based on one or more laser surface processing operations on a first semiconductor workpiece 110 and apply the adjustments to one or more laser parameters for a laser surface processing operation on a second semiconductor workpiece 110.

Figure 9:
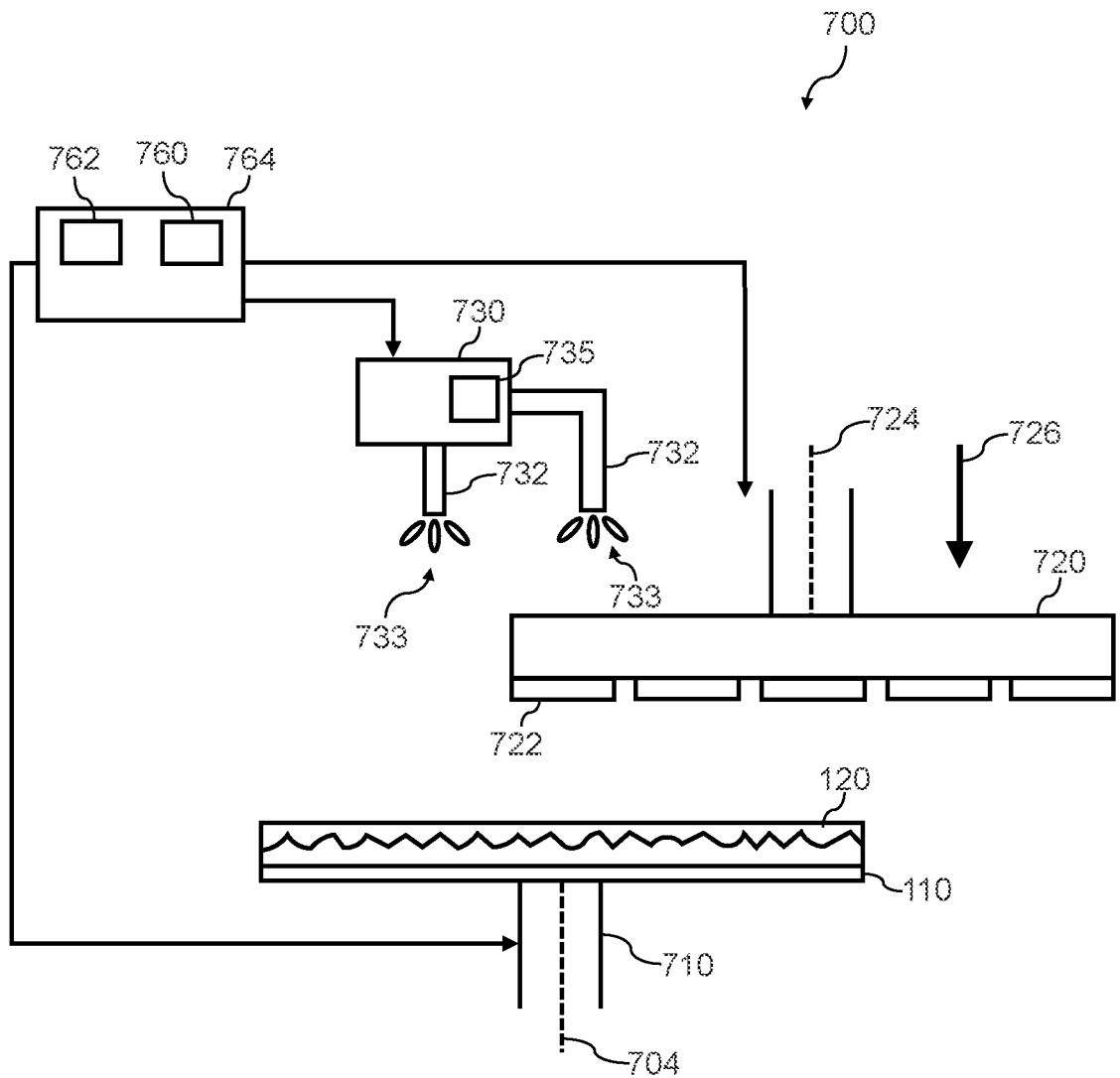
FIG. 9 depicts an example grinding system for grinding a semiconductor workpiece according to example embodiments of the present disclosure.

FIG. 9 depicts an example grinding system 700 for implementing a planar surface processing operation by grinding a semiconductor workpiece 110 with filler material 120 according to example embodiments of the present disclosure. The grinding system 700 includes a workpiece support 710, a grinding apparatus such as a grind wheel 720, a fluid delivery system 730, and a controller 760.

FIG. 9 depicts an example grinding system 700 for purposes of illustration and discussion. Those of ordinary skill in the art, using the disclosures provided herein, will understand that other grinding systems may be used without deviating from the scope of the present disclosure, such as grinding systems that include a grind disc.

More specifically, the grinding system 700 includes the workpiece support 710. The workpiece support 710 may be operable to support or carry the semiconductor workpiece 110. The workpiece support 710 may include a chuck operable to hold the semiconductor workpiece 110. The chuck may be a vacuum chuck, electrostatic chuck, or other suitable support operable to hold the semiconductor workpiece 110 in place during a grinding operation. The workpiece support 710 may be operable to rotate about an axis 704. The workpiece support 710 may be operable to rotate about the axis 704 in either a clockwise or counterclockwise direction. In some examples, the workpiece support 710 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm.

The grinding system 700 includes a grind wheel 720. The grind wheel 720 includes a plurality of grinding teeth 722 arranged in an annular configuration about the grind wheel 720. The grinding teeth 722 provide an abrasive surface for the grind wheel 720. Each of the grinding teeth 722 may include an abrasive containing material. The abrasive containing material of the grinding teeth 722 may be sufficient to perform a grinding operation on silicon carbide. In some embodiments, the grinding operation may be a coarse grinding operation or a fine grinding operation.

The abrasive containing material may include a plurality of abrasive elements (e.g., abrasive particles) in a host material or matrix. In some examples, the host material may include one or more of vitreous material, metal, resin, and/or other sintered material and/or organic material. The vitreous material may be a glass matrix material to hold the abrasive elements inside a matrix. Metals and/or organic materials may be used as a host matrix or as part of a host matrix for the abrasive elements. The abrasive elements in some embodiments, may be diamond (e.g., diamond abrasive particles) or a diamond coated material. In some embodiments, the abrasive elements may be, for instance, a ceramic material (e.g., ceramic abrasive particles). The ceramic material may be, for instance, boron carbide ($B_4C$) and cubic boron nitride (BN). In some examples, the abrasive elements may include one or more metal oxides (sintered and/or unsintered). In some embodiments, the abrasive elements may include silica, ceria, zirconia, alumina, silicon carbide, metal nitrides, and/or other carbides or in general one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. In some examples, the abrasive elements of the grinding teeth 722 may have a hardness in a range of about 7 Mohs to about 10 Mohs, such as about 10 Mohs.

The grind wheel 720 may be operable to rotate about an axis 724. The axis 724 is not aligned with the axis 704 associated with the workpiece support 710. The grind wheel 720 may be operable to rotate in either a clockwise or counterclockwise direction. In some examples, the grind wheel 720 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm. The grind wheel 720 may rotate in the same direction as the workpiece support 710 or in a different direction relative to the workpiece support 710.

The grind wheel 720 may be controlled to provide a downforce 726 on the silicon carbide semiconductor workpiece 110. The downforce 726 may be controlled to adjust the grinding rate of the grinding operation of the silicon carbide semiconductor workpiece 110. A higher downforce 176 may result in a faster grinding rate. The grind wheel 720 may be controlled to be in contact with the semiconductor workpiece 110 such that plurality of grinding teeth 722 pass through a center of the semiconductor workpiece 110 during a grinding operation.

As shown in FIG. 9, the grinding system 700 may include a fluid delivery system 730. The fluid delivery system 730 may be used to deliver a fluid 733 (e.g., coolant), such as deionized water, to a surface of the semiconductor workpiece 110 and/or the grind wheel 720 (e.g., the grinding teeth 722) during a grinding process. The fluid delivery system 730 is depicted as having two fluid delivery outlets 732 for purposes of illustration and discussion. Those of ordinary skill in the art, using the disclosures provided herein, will understand that the grinding system 700 may include more or fewer fluid delivery outlets arranged to deliver a fluid 733 to the grind wheel 720 and/or the semiconductor workpiece 710 without deviating from the scope of the present disclosure.

In some examples, the fluid delivery system 730 may include or be coupled to an additive delivery system 735. The additive delivery system 735 may be configured to provide one or more additives with the fluid 733 (e.g., coolant) through the fluid delivery system 730. In some examples, the additive may include one or more of an oxidizing agent, an etchant, or an abrasive containing additive. In some examples, the additive may include an actuatable additive. In some examples, the additive may be a surfactant and/or a lubricant that affects the transport of grind products.

The grinding system 700 includes one or more control devices, such as a controller 760. The controller 760 may include one or more processors 762 and one or more memory devices 764. The one or more memory devices 764 may store computer-readable instructions that when executed by the one or more processors 762 cause the one or more processors 762 to perform one or more control functions, such as any of the functions described herein. The controller 760 may be in communication with various other aspects of the grinding system 700 through one or more wired and/or wireless control links. The controller 760 may send control signals to the various components of the grinding system 700 (e.g., the workpiece support 710, the grind wheel 720, the fluid delivery system 730) to implement a grinding operation on the silicon carbide semiconductor workpiece 110.

Figure 10:
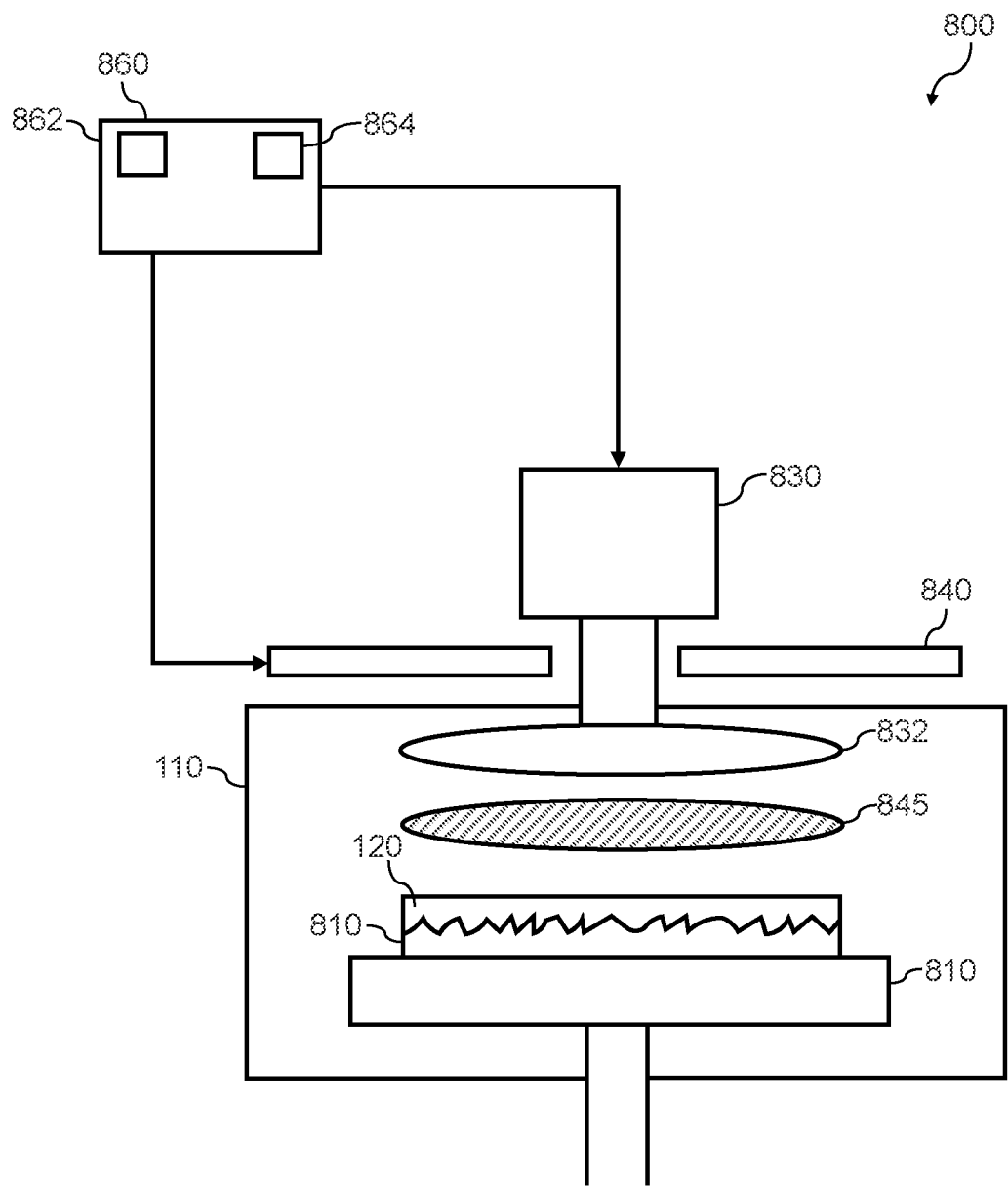
FIG. 10 depicts an example plasma and/or sputtering system for performing a plasma-based process and/or a sputtering process according to example embodiments of the present disclosure.

FIG. 10 depicts a plasma-based processing and/or sputtering process system 800 operable to provide a plasma-based surface processing operation and/or sputtering process operation according to examples of the present disclosure. The system 800 includes a chamber 810, a workpiece support 820, a process gas source 830, and a plasma and/or ion source 840.

The workpiece support 820 may include a chuck (e.g., electrostatic chuck) or other mechanism to hold the semiconductor workpiece 110 in place during plasma-based processing and/or sputtering processing according to examples of the present disclosure. The semiconductor workpiece 110 may include a filler material 120 thereon according to examples of the present disclosure.

The process gas source 830 may be operable to deliver a process gas to the chamber 810, for instance, using a showerhead 832 or other gas delivery outlet. The plasma and/or ion source 840 may be configured to induce a plasma 845 in the process gas or produce ions. The plasma 845 is used to etch or otherwise process the filler material 120 and the semiconductor workpiece 110. In some examples, radiation from the plasma 845 (e.g., UV light) may be used to cure the filler material 120. The plasma and/or ion source 840 may be, for instance, an one or more of an inductively coupled plasma source, capacitively coupled plasma source, microwave plasma source, transformer coupled plasma source, helicon wave plasma source, etc. or combination of any of the foregoing sources.

The plasma-based processing system and/or sputtering system 800 includes one or more control devices, such as a controller 860. The controller 860 may include one or more processors 862 and one or more memory devices 864. The one or more memory devices 864 may store computer-readable instructions that when executed by the one or more processors 862 cause the one or more processors 862 to perform one or more control functions, such as any of the functions described herein. The controller 860 may be in communication with various other aspects of the plasma-based processing system and/or sputtering process system 800 through one or more wired and/or wireless control links. In some embodiments, the controller 860 may be configured to control the delivery of process gas from the gas source 830 and control the plasma-based process and/or sputtering process through control of the plasma and/or ion source 840.

Figure 11:
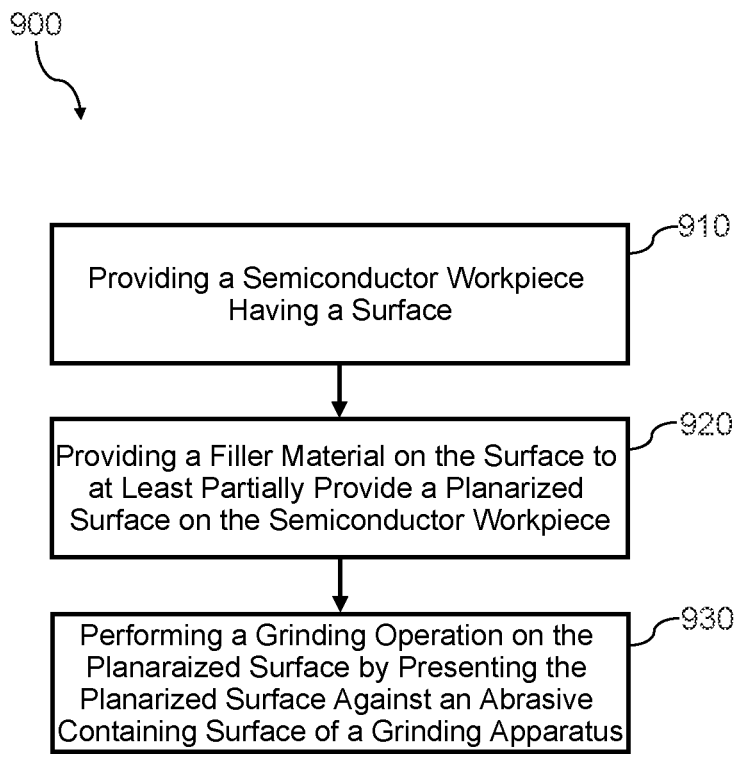
FIG. 11 depicts a flow diagram of an example method according to example embodiments of the present disclosure.

FIG. 11 depicts a flow diagram of a method 900 according to example aspects of the present disclosure. The method 900 depicts operations performed in a particular order for purposes of illustration and discussion. Those of ordinary skill in the art, using the disclosures provided herein, will understand that the operations of any of the methods described herein may be adapted, expanded, performed simultaneously, omitted, rearranged, include steps not illustrated, and/or modified in various ways without deviating from the scope of the present disclosure.

At 910, the method 900 includes providing a semiconductor workpiece having a surface. In some examples, the semiconductor workpiece may include silicon carbide. In some examples, the semiconductor workpiece may be a semiconductor wafer and may have an associated surface roughness greater than about 10 microns, such as greater than about 50 microns, such as greater than about 65 microns.

At 920, the method 900 includes providing a filler material on the surface to at least partially provide a planarized surface on the semiconductor workpiece (e.g., the filler material is on at least a portion of the surface of the semiconductor workpiece). In some examples, the planarized surface may be identified by an associated surface roughness that is less than the surface roughness of the surface of the semiconductor workpiece prior to providing the filler material. In some examples, the planarized surface has a surface roughness of less than about 65 microns, such as less than about 50 microns, such as less than about 10 microns, such as less than about 1 micron, such as less than about 500 nanometers, such as less than about 100 nanometers, such as in a range of about 0.5 nanometers to about 180 nanometers, such as in range of about 180 nanometers to about 1 micron, such as in a range of about 1 micron to about 10 microns, such as in a range of about 1 micron to about 65 microns In some examples, the filler material may be a sol-gel defined liquid. In some examples, the filler material may be a spin-coatable glass. In some examples, the filler material may be a ceramic composite. In some examples, the filler material may be or include organosilicone, such as tetraethyl orthosilicate (TEOS), tetramethylcyclotetra-siloxane (TMCTS), polydimethylsiloxane (PDMS), cyclic siloxanes, or related compounds. In some examples, the filler material may be a hydrate with a metal oxide precursor (e.g., $ZnOx$ $H_2O$) or nitrate precursor (e.g., $Ga(NO_3)_3 xH_2O$). While example filler materials have been discussed herein, it should be appreciated that any sol gel processes that creates liquid processable materials with properties required for a selected surface removal process may be used as a filler material according to the present disclosure.

In some examples, the filler material may be a non-sol gel material that may fill the substrate surface topography. For instance, the filler material may be a curable liquid composite that may be engineered to fill deep topographical areas, adhere to surfaces, and be curable into a hard solid through a curing process via exposure to radiation (e.g., visible light or UV light). In some examples, the filler material may be cured through any suitable curing processes, such as photo curing, thermal curing, chemical curing, microwave absorption curing, pressure curing, ambient curing, electromagnetic radiation curing, electrochemical curing, or other suitable curing processes.

As an example, the filler material may be a photo-curable resin-based composite (PCRB). Suitable PCRB's may be a mixture of photopolymerizable monomers, photoactive polymerization initiators, and a surface functionalized filler (SFF).

In some examples, the PCRB may include a resin binder with a mixture of two methacrylate terminated monomers that may include, for instance, a base monomer and diluent monomer. Example base monomers may include, for instance, bisphenol A glycol dimethacrylate (Bis-GMA), ethoxylated bisphenol A glycol dimethacrylate (Bis-EMA), or urethane dimethacrylate (UDMA). Example dilutant monomers may include, for instance, triethylene glycol dimethacrylate (TEDGMA), decanediol dimethacrylate (D3MA), or 2-hydroxyethyl methacrylate (HEMA). Filler materials that include a PCRB with a resin binder may be curable using a free radical initiator. Example free radical initiators may include a camphorquinone mixed with an amine photo-polymerization accelerator such as ethyl 4-(dimethylamino)benzoate, N,N-dimethylaminoethyl methacrylate, 2-ethyl-dimethylbenzoate, N,N-dimethyl-p-toluidine, or N-phenylglycine.

In some examples, the SFFs in the PCRB may include microparticles or nanoparticles of, for instance, ceramics, inorganic compounds, metals, metalloids, minerals, non-metallic elements, inorganic-inorganic hybrid materials, inorganic-inorganic composites, organic compounds, organic-inorganic hybrid materials, organic-inorganic composites, or similar materials. The surface functionalized fillers may include microparticles or nanoparticles with matched properties to a semiconductor wafer material and surface removal process. In some example SFFs, compounds may be used to functionalize the surface of the particles, promote dispersion and couple to the resin matrix during curing of a PCRB. In some examples, these compounds may include 10-methacryloyloxydecyl dihydrogen phosphate, dipentaerythritol penta-acrylate phosphate, thiourethane oligomers, or similar materials.

At 930, the method 900 includes performing a grinding operation on the planarized surface by presenting the planarized surface (e.g., with the filler material) against an abrasive containing surface of a grinding apparatus. According to examples of the present disclosure, the filler material may have a hardness sufficient to dress the abrasive containing surface of a grinding apparatus used during the grinding operation. For instance, the filler material may have a hardness sufficient to remove abrasive elements from the abrasive containing surface of the grinding apparatus and expose new abrasive elements. In some embodiments, the filler material has a hardness in a range of about 7 Mohs to about 10 Mohs.

As discussed above, one or more lasers during a laser-based surface processing operation and/or one or more scanning heads (e.g., including a filler material source, curing source, etc.) may scan the surface of a workpiece (e.g., semiconductor wafer) to implement aspects of the present disclosure. Various scan patterns may be used without deviating from the scope of the present disclosure. In some examples, the scan patterns may be selected to impose a pattern into the workpiece (e.g., for fiducial marking or dicing).

Figures 12, 13, 14, 15, 16:
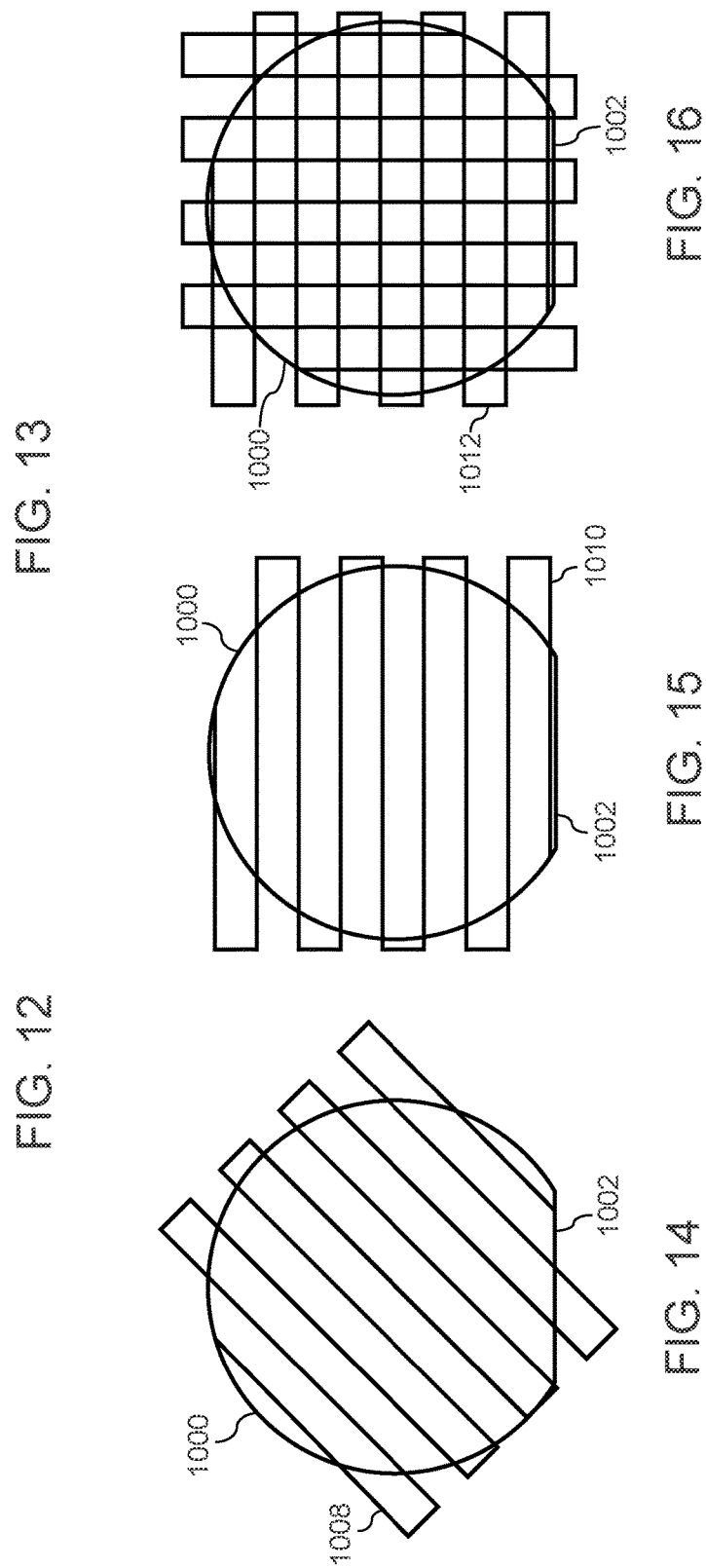
FIGS. 12-18 depict example scan patterns according to example embodiments of the present disclosure.

FIG. 12 depicts an example scan pattern 1004 on an example semiconductor wafer 1000 (e.g., silicon carbide semiconductor wafer) according to example embodiments of the present disclosure. The scan pattern depicted in FIG. 12 comprises a plurality of parallel scans or passes in a direction generally perpendicular to, for instance, a flat 1002 of the semiconductor wafer 1000.

FIG. 13 depicts an example scan pattern 1006 on an example semiconductor wafer 1000 (e.g., silicon carbide semiconductor wafer) according to example embodiments of the present disclosure. The scan pattern 1006 depicted in FIG. 13 comprises a spiral scan pattern on a surface of the semiconductor wafer 1000.

FIG. 14 depicts an example scan pattern 1008 on an example semiconductor wafer 1000 (e.g., silicon carbide semiconductor wafer) according to example embodiments of the present disclosure. The scan pattern 1008 depicted in FIG. 14 comprises a plurality of generally parallel scans or passes in a direction that is angled (not generally perpendicular and not generally parallel) to, for instance, a flat 1002 of the semiconductor wafer 1000.

FIG. 15 depicts an example scan pattern 1010 on an example semiconductor wafer 1000 (e.g., silicon carbide semiconductor wafer) according to example embodiments of the present disclosure. The scan pattern 1010 depicted in FIG. 15 comprises a plurality of generally parallel scans or passes in a direction that is generally parallel to, for instance, a flat 1002 of the semiconductor wafer 1000.

FIG. 16 depicts an example scan pattern 1012 on an example semiconductor wafer 1000 (e.g., silicon carbide semiconductor wafer) according to example embodiments of the present disclosure. The scan pattern 1012 depicted in FIG. 16 comprises a plurality of generally parallel scans or passes and a plurality of generally perpendicular scans or passes to, for instance, a flat 1002 of the semiconductor wafer 1000.

Other suitable laser scan patterns may be used without deviating from the scope of the present disclosure. For instance, the laser scan pattern may be an irregular or a random scan pattern. As additional non-limiting examples, the laser scan pattern may be a spot pattern, non-continuous pattern, zig zag pattern, herringbone pattern, chevron pattern, array of polygons, concentric circles, or other suitable pattern.

Figure 17:
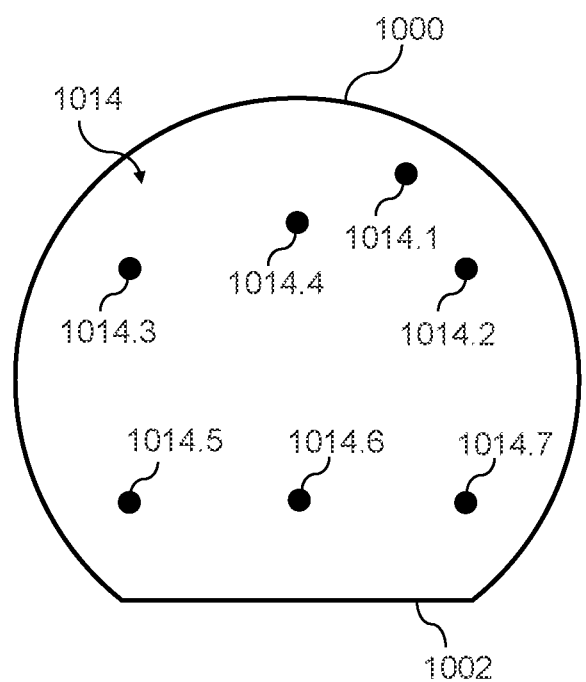

For instance, FIG. 17 depicts an example non-continuous scan pattern 1014 on an example semiconductor wafer 1000 (e.g., silicon carbide semiconductor wafer) according to example embodiments of the present disclosure. The scan pattern 1014 depicted in FIG. 17 includes a plurality of discrete and separated scan points 1014.1, 1014.2, . . . 1014.n on the semiconductor wafer 1000. For instance, workpiece property data (e.g., sensor data associated with one or more workpiece properties) may indicate the presence of local peak topographical areas on the semiconductor wafer 1000. The laser scan pattern 1014 can provide emission of the laser on the discrete points 1014.1, 1014.2, . . . 1014.n to remove the local peak topographical areas. The discrete points can be in a regular pattern or in a scattered, irregular pattern.

Figure 18:
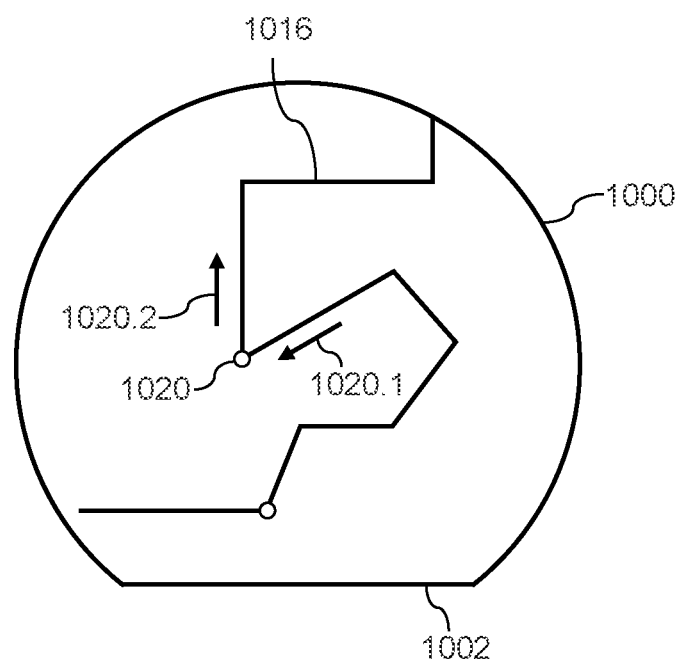

In some embodiments, the scan pattern may be adjusted (e.g., while scanning the semiconductor wafer) based on data, such as sensor data associated with one or more workpiece properties. For instance, FIG. 18 depicts an example scan pattern 1018 on an example semiconductor wafer 1000 (e.g., silicon carbide semiconductor wafer) according to example embodiments of the present disclosure. The scan pattern 1018 has been adjusted, for instance, at point 1020 from a first direction 1020.1 to a second direction 1020.2. In some embodiments, the scan pattern 1018 may be adjusted, for instance, based on data associated with one or more workpiece properties. For instance, the scan pattern 1018 may change directions to address high surface topographical areas (e.g., peaks or valleys) or other features on the surface of the semiconductor wafer 1000. The scan pattern 1018 may be adjusted based on other factors without deviating from the scope of the present disclosure.

Example aspects of the present disclosure are set forth below. Any of the below features or examples may be used in combination with any of the embodiments or features provided in the present disclosure.

One example aspect of the present disclosure is directed to a method. The method includes providing a semiconductor workpiece having a surface, the semiconductor workpiece including silicon carbide. The method includes providing a filler material on at least a portion of the surface. The method includes, subsequent to providing the filler material, performing a surface processing operation on the surface.

In some examples, the filler material has a first removal rate that is within 20% of a second removal rate associated with the silicon carbide of the semiconductor workpiece for the surface processing operation.

In some examples, the filler material has a first removal rate that is less than a second removal rate associated with the silicon carbide of the semiconductor workpiece for the surface processing operation.

In some examples, the surface processing operation is a planar surface processing operation.

In some examples, the planar surface processing operation is one or more of a grinding operation or a polishing operation.

In some examples, the surface processing operation is a non-planar surface processing operation.

In some examples, the non-planar surface processing operation includes one or more of a laser-based surface processing operation, electrochemical operation, reactive ion etching (RIE) based surface processing operation, plasma-based surface processing operation, sputtering-based surface processing operation, or a wet etch-based surface processing operation.

In some examples, method comprises curing the filler material with photo-curing, thermal curing, chemical curing, microwave curing, pressure curing, electromagnetic radiation curing, or electrochemical curing.

In some examples, the filler material is a sol-gel defined liquid.

In some examples, the filler material includes a spin-coatable glass.

In some examples, the filler material includes an organo-silicone.

In some examples, the filler material includes a hydrate.

In some examples, the filler material includes a photo-curable composite.

In some examples, the photo-curable composite includes a resin binder, a free radical initiator, and one or more fillers.

In some examples, the photo-curable composite is curable with radiation having a wavelength in a range of about 460 nanometers to about 470 nanometers.

In some examples, the photo-curable composite is curable with ultraviolet light.

In some examples, the surface processing operation includes a plasma-based surface processing operation, wherein a plasma generated during the plasma etching process cures the photo-curable composite.

In some examples, the filler material comprises a ceramic composite.

In some examples, the surface processing operation is a laser-based surface processing operation.

In some examples, the filler material has an optical property that changes an application of a laser during the laser-based surface processing operation.

In some examples, the filler material is operable to change a focal depth of the laser during the laser-based surface processing operation.

In some examples, providing the filler material includes providing the filling material from a filler material source along a scan path corresponding to a scan path associated with the laser during the laser-based surface processing operation.

In some examples, the filler material includes a liquid.

In some examples, the method includes replenishing the liquid on the surface of the semiconductor workpiece during the surface processing operation.

In some examples, the semiconductor workpiece is at least partially submerged in the filler material during the surface processing operation.

One example aspect of the present disclosure is directed to a semiconductor wafer. The semiconductor wafer includes silicon carbide. The semiconductor wafer includes a filler material on at least a portion of a surface of the semiconductor wafer, the filler material being one or more of a spin coatable glass, an organosilicone, a hydrate, a photo-curable composite, or a ceramic composite.

In some examples, the filler material provides a planarized surface of the semiconductor wafer.

In some examples, the surface of the semiconductor wafer with the filler material has a surface roughness of less than about 100 nanometers.

In some examples, the filler material includes one or more of TEOS (tetraethyl orthosilicate), TMCTS (tetramethylcyclotetra-siloxane), cyclic siloxanes, or PDMS (polydimethylsiloxane).

In some examples, the filler material includes a hydrate with a metal oxide precursor or a nitrate precursor.

In some examples, the filler material includes a photo-curable resin composite.

In some examples, the photo-curable composite includes a resin binder, a free radical initiator, and one or more fillers.

In some examples, the photo-curable composite is curable with radiation having a wavelength in a range of about 460 nanometers to about 470 nanometers.

In some examples, the photo-curable composite is curable with ultraviolet light.

In some examples, the semiconductor wafer has a diameter of about 150 mm.

In some examples, the semiconductor wafer has a diameter of about 200 mm.

One example aspect of the present disclosure is directed to a method. The method includes removing a wide bandgap semiconductor wafer from a boule using a laser-based removal process. The method includes providing a filler material on at least a portion of an exposed surface of the wide bandgap semiconductor wafer, the filler material at least partially filling one or more deep topographical areas on the exposed surface.

In some examples, the filler material has a thickness in a range of 100 microns to 1500 microns.

In some examples, the filler material is a carrier for the wide bandgap semiconductor wafer.

In some examples, the method includes performing a surface processing operation on the filler material and the wide bandgap semiconductor wafer to remove the filler material.

In some examples, the surface processing operation is a planar surface processing operation.

In some examples, the planar surface processing operation is one or more of a grinding operation or a polishing operation.

In some examples, the surface processing operation is a non-planar surface processing operation.

In some examples, the non-planar surface processing operation includes one or more of a laser-based surface processing operation, reactive ion etching (RIE) based surface processing operation, plasma-based surface processing operation, sputtering-based surface processing operations, or a wet etch-based surface processing operation.

In some examples, the filler material is a sol-gel defined liquid.

In some examples, the filler material includes a spin coatable glass.

In some examples, the filler material includes an organo-silicone.

In some examples, the filler material includes a hydrate.

In some examples, the filler material includes a photo-curable composite.

In some examples, the photo-curable composite includes a resin binder, a free radical initiator, and one or more fillers.

In some examples, the photo-curable composite is curable with radiation having a wavelength in a range of about 460 nanometers to about 470 nanometers.

In some examples, the photo-curable composite is curable with ultraviolet light.

In some examples, the method includes a plasma etching process, wherein a plasma generated during the plasma etching process cures the photo-curable composite.

One example aspect of the present disclosure is directed to a method. The method includes providing a semiconductor workpiece having a surface. The method includes providing a filler material on at least a portion of the surface. The method includes performing a grinding operation on the surface by presenting the surface against an abrasive containing surface of a grinding apparatus. In some examples, the filler material has a hardness sufficient to dress the abrasive containing surface of a grinding apparatus used during the grinding operation.

In some examples, the abrasive containing surface includes one or more grinding teeth on a grind wheel.

In some examples, the abrasive containing surface includes a grind disc.

In some examples, the filler material includes a photo-curable composite.

In some examples, the photo-curable composite includes a resin binder, a free radical initiator, and one or more fillers.

In some examples, the one or more fillers of the photo-curable composite includes silicon carbide.

In some examples, the photo-curable composite is curable with light having a wavelength in a range of about 460 nanometers to about 470 nanometers.

In some examples, the semiconductor workpiece includes silicon carbide.

In some examples, the filler material has a hardness in a range of 7 Mohs to 10 Mohs.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method, comprising:
   providing a semiconductor workpiece having a surface, the semiconductor workpiece comprising silicon carbide;
   providing a filler material on at least a portion of the surface;
   subsequent to providing the filler material, performing a laser-based surface processing operation on the surface, wherein the filler material has an optical property that changes an application of a laser during the laser-based surface processing operation.

2. The method of claim 1, wherein the filler material has a first removal rate that is within 20% of a second removal rate associated with the silicon carbide of the semiconductor workpiece for the surface processing operation.

3. The method of claim 1, wherein the filler material has a first removal rate that is less than a second removal rate associated with the silicon carbide of the semiconductor workpiece for the surface processing operation.

4. The method of claim 1, wherein the surface processing operation is a non-planar surface processing operation.

5. The method of claim 1, wherein the method comprises curing the filler material with photo-curing, thermal curing, chemical curing, microwave curing, pressure curing, electromagnetic radiation curing, or electrochemical curing.

6. The method of claim 1, wherein the filler material is a sol-gel defined liquid, a spin-coatable glass, an organosilicone, or a hydrate.

7. The method of claim 1, wherein providing the filler material comprises providing the filler material from a filler material source along a scan path corresponding to a scan path associated with the laser during the laser-based surface processing operation.

8. The method of claim 1, wherein the filler material comprises a liquid.

9. The method of claim 8, wherein the method comprises replenishing the liquid on the surface of the semiconductor workpiece during the surface processing operation.

10. A method, comprising:
    providing a semiconductor workpiece having a surface, the semiconductor workpiece comprising silicon carbide;
    providing a filler material on at least a portion of the surface, wherein the filler material comprises a liquid;
    subsequent to providing the filler material, performing a surface processing operation on the surface, wherein the method comprises replenishing the liquid on the surface of the semiconductor workpiece during the surface processing operation.

11. The method of claim 10, wherein the semiconductor workpiece is at least partially submerged in the filler material during the surface processing operation.

12. The method of claim 10, wherein the filler material has a first removal rate that is within 20% of a second removal rate associated with the silicon carbide of the semiconductor workpiece for the surface processing operation.

13. The method of claim 10, wherein the filler material has a first removal rate that is less than a second removal rate associated with the silicon carbide of the semiconductor workpiece for the surface processing operation.

14. The method of claim 10, wherein the surface processing operation is a planar surface processing operation.

15. The method of claim 10, wherein the surface processing operation is a non-planar surface processing operation.

16. The method of claim 10, wherein the semiconductor workpiece has a diameter of about 150 millimeters.

17. The method of claim 10, wherein the semiconductor workpiece has a diameter of about 200 millimeters.

18. The method of claim 10, wherein the filler material has an optical property that changes an application of a laser during the surface processing operation.

19. The method of claim 18, wherein the filler material is operable to change a focal depth of the laser during the surface processing operation.

20. The method of claim 10, wherein the filler material has an electrical conductivity property, an optical property, a rheological property, a wettability, or a coefficient of thermal expansion configured to enhance the surface processing operation.

* * * * *